(12) United States Patent
Asano et al.

(10) Patent No.: US 9,704,976 B2
(45) Date of Patent: Jul. 11, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Yuji Asano, Atsugi (JP); Junichi Koezuka, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/886,759

(22) Filed: Oct. 19, 2015

(65) Prior Publication Data
US 2016/0043201 A1 Feb. 11, 2016

Related U.S. Application Data

(62) Division of application No. 12/748,521, filed on Mar. 29, 2010, now abandoned.

(30) Foreign Application Priority Data

Apr. 2, 2009 (JP) ................. 2009-090428

(51) Int. Cl.
*H01L 21/00* (2006.01)
*H01L 29/66* (2006.01)
(Continued)

(52) U.S. Cl.
CPC .. *H01L 29/66969* (2013.01); *H01L 21/02565* (2013.01); *H01L 21/02631* (2013.01);
(Continued)

(58) Field of Classification Search
CPC ............. H01L 27/1214; H01L 27/1225; H01L 27/1228; H01L 29/7869; H01L 29/42384;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 0827210 A 3/1998
EP 1737044 A 12/2006
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
(Continued)

*Primary Examiner* — Vongsavanh Sengdara
(74) *Attorney, Agent, or Firm* — Eric J. Robinson; Robinson Intellectual Property Law Office, P.C.

(57) ABSTRACT

An object is to provide a thin film transistor using an oxide semiconductor layer, in which contact resistance between the oxide semiconductor layer and source and drain electrode layers is reduced and electric characteristics are stabilized. The thin film transistor is formed in such a manner that a buffer layer including a high-resistance region and low-resistance regions is formed over an oxide semiconductor layer, and the oxide semiconductor layer and source and drain electrode layers are in contact with each other with the low-resistance region of the buffer layer interposed therebetween.

8 Claims, 31 Drawing Sheets

(51) Int. Cl.
*H01L 27/12* (2006.01)
*H01L 29/786* (2006.01)
*H01L 21/02* (2006.01)
*H01L 21/477* (2006.01)
*H01L 29/423* (2006.01)

(52) U.S. Cl.
CPC ........ *H01L 21/477* (2013.01); *H01L 27/1214* (2013.01); *H01L 27/1225* (2013.01); *H01L 27/1288* (2013.01); *H01L 29/42384* (2013.01); *H01L 29/7869* (2013.01); *H01L 29/78696* (2013.01)

(58) Field of Classification Search
CPC ......... H01L 29/66969; H01L 29/78696; H01L 21/02565; H01L 21/477; H01L 21/02631
USPC ....................................................... 438/104
See application file for complete search history.

(56) References Cited

U.S. PATENT DOCUMENTS

| | | | |
|---|---|---|---|
| 5,847,410 A | 12/1998 | Nakajima | |
| 5,913,112 A * | 6/1999 | Yamazaki | H01L 21/76897 257/E21.413 |
| 6,050,827 A * | 4/2000 | Takechi | H01L 29/41733 257/42 |
| 6,285,041 B1 | 9/2001 | Noguchi | |
| 6,294,274 B1 | 9/2001 | Kawazoe et al. | |
| 6,461,901 B1 | 10/2002 | Noguchi | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,884,360 B2 | 2/2011 | Takechi et al. | |
| 7,998,372 B2 | 8/2011 | Yano et al. | |
| 8,013,331 B2 | 9/2011 | Wakita | |
| 8,143,678 B2 | 3/2012 | Kim et al. | |
| 8,193,045 B2 | 6/2012 | Omura et al. | |
| 8,258,023 B2 | 9/2012 | Lee | |
| 8,420,442 B2 | 4/2013 | Takechi et al. | |
| 8,558,323 B2 | 10/2013 | Kim et al. | |
| 8,785,240 B2 | 7/2014 | Watanabe | |
| 9,153,703 B2 | 10/2015 | Kaji et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 * | 5/2006 | Baude | H01L 27/3244 313/506 |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0215945 A1 | 9/2007 | Tokunaga et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0035920 A1 | 2/2008 | Takechi et al. | |
| 2008/0038882 A1 * | 2/2008 | Takechi | H01L 29/4908 438/151 |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0213140 A1 * | 9/2008 | Tabata | C01B 13/11 422/186.07 |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 * | 10/2008 | Lee | H01L 21/02554 257/43 |
| 2008/0258141 A1 * | 10/2008 | Park | H01L 29/78618 257/43 |
| 2008/0258143 A1 | 10/2008 | Kim et al. | |
| 2008/0296568 A1 * | 12/2008 | Ryu | H01L 21/02554 257/43 |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0008667 A1 * | 1/2009 | Fujii | H01L 51/0005 257/98 |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0294772 A1 * | 12/2009 | Jeong | H01L 27/1225 257/59 |

(56) References Cited

U.S. PATENT DOCUMENTS

| | | | |
|---|---|---|---|
| 2009/0315026 A1* | 12/2009 | Jeong | H01L 29/45 257/43 |
| 2010/0025678 A1 | 2/2010 | Yamazaki et al. | |
| 2010/0065844 A1 | 3/2010 | Tokunaga | |
| 2010/0073268 A1 | 3/2010 | Matsunaga et al. | |
| 2010/0092800 A1 | 4/2010 | Itagaki et al. | |
| 2010/0109002 A1 | 5/2010 | Itagaki et al. | |
| 2010/0252832 A1 | 10/2010 | Asano et al. | |
| 2012/0319103 A1 | 12/2012 | Lee | |
| 2013/0237012 A1 | 9/2013 | Takechi et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 10-074946 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-142195 A | 6/2007 |
| JP | 2007-150158 A | 6/2007 |
| JP | 2007-250983 A | 9/2007 |
| JP | 2008-040343 A | 2/2008 |
| JP | 2008-042088 A | 2/2008 |
| JP | 2008-176262 A | 7/2008 |
| JP | 2008-199005 A | 8/2008 |
| JP | 2008-218495 A | 9/2008 |
| JP | 2008-276211 A | 11/2008 |
| JP | 2008-281988 A | 11/2008 |
| JP | 2010-525602 | 7/2010 |
| JP | 2015-008305 A | 1/2015 |
| WO | WO-2004/114391 | 12/2004 |
| WO | WO-2007/119386 | 10/2007 |
| WO | WO-2007/148601 | 12/2007 |
| WO | WO-2008/105250 | 9/2008 |
| WO | WO-2008/126879 | 10/2008 |
| WO | WO-2008/126883 | 10/2008 |
| WO | WO-2008/133456 | 11/2008 |
| WO | WO-2008/149873 | 12/2008 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters), June 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD GrownZNO TFT", IMID '07 Digest, 2007, pp. 1249-1252.

(56) References Cited

OTHER PUBLICATIONS

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (Zno TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amporphous In—Ga—Zn—Oxide TFT", AM-FPD '09 Digest of Technical Papers, Jul. 1, 2009, pp. 41-44.

Ohara.H et al., "21.3:4.0 IN. QVGA AMOLED Display Using In—Ga—Zn—Oxide TFTs With a Novel Passivation Layer", SID Digest '09 : SID International Symposium Digest of Technical Papers May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YBFe2O4, and YB2Fe3O7 Types of Structures for Compounds in the In2O3 and Sc2O3—A2O3—BO Systems [A;Fe, Ga, Or, Al; B: Mg, Mn, Fe, Ni, Cu, Or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent Philosophical conductive oxide InGaO3(ZnO)m (m<4):a Zn4s conductor", Philosophical Magazine, 2001, vol. 81, No. 5, pp. 501-515.

Janotti.A et al., "Oxygen Vacancies In ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) ,2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Syposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of SOL-GEL-Derived Zinc Oxide Films by Irradiation with Ultraviolet Lamp", Journal of SOL-GEL Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb.1, 2003, vol. 93, No. 3, pp. 1624-1630.

Oh.M et al., "Improving the Gate Stability of ZnO Thin-Film Transistors With Aluminum Oxide Dielectric Layers", J.

(56) References Cited

OTHER PUBLICATIONS

Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letter), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakamura.M et al., "Syntheses and crystal structures of new homologous compounds, indium iron zinc oxides (inFeO3(ZnO)m) (m natural number) and related compounds", Kotai Butsuri (Solid State Physics), 1993, vol. 28, No. 5, pp. 317-327.

Chinese Office Action (Application No. 201010159694.5) Dated Dec. 2, 2013.

Taiwanese Office Action (Application No. 99108014) Dated Sep. 30, 2014.

Korean Office Action (Application No. 2010-0029774) Dated Jan. 24, 2017.

\* cited by examiner

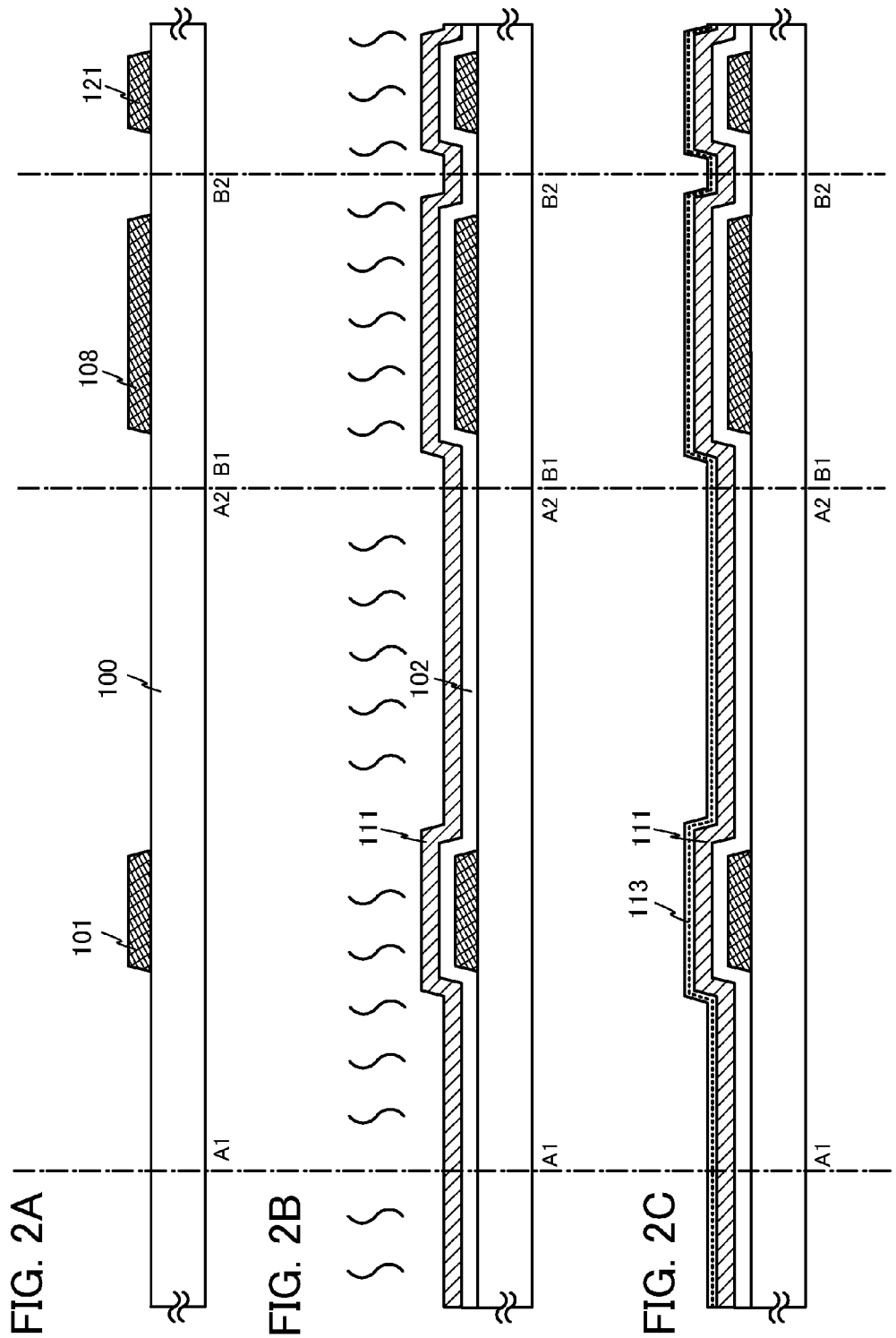

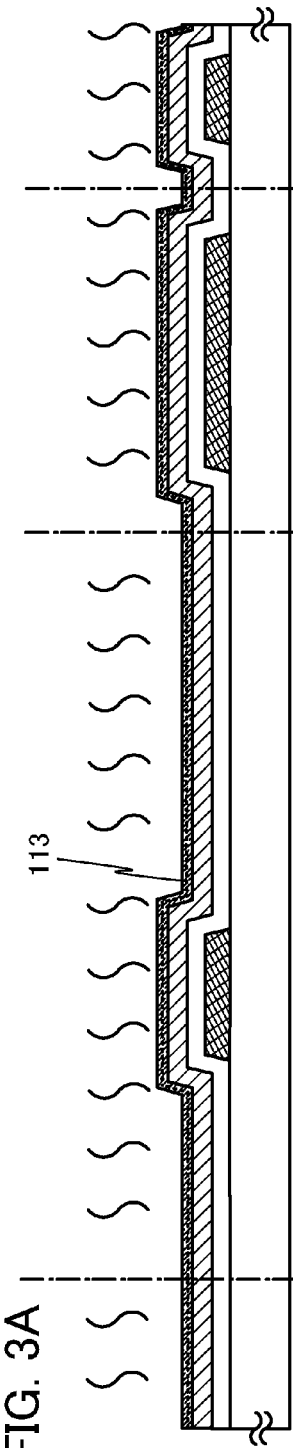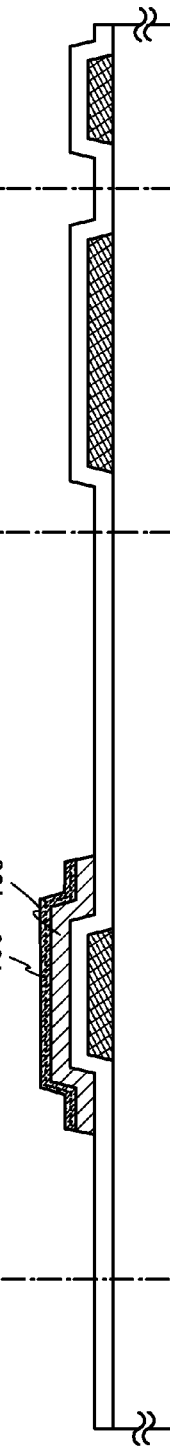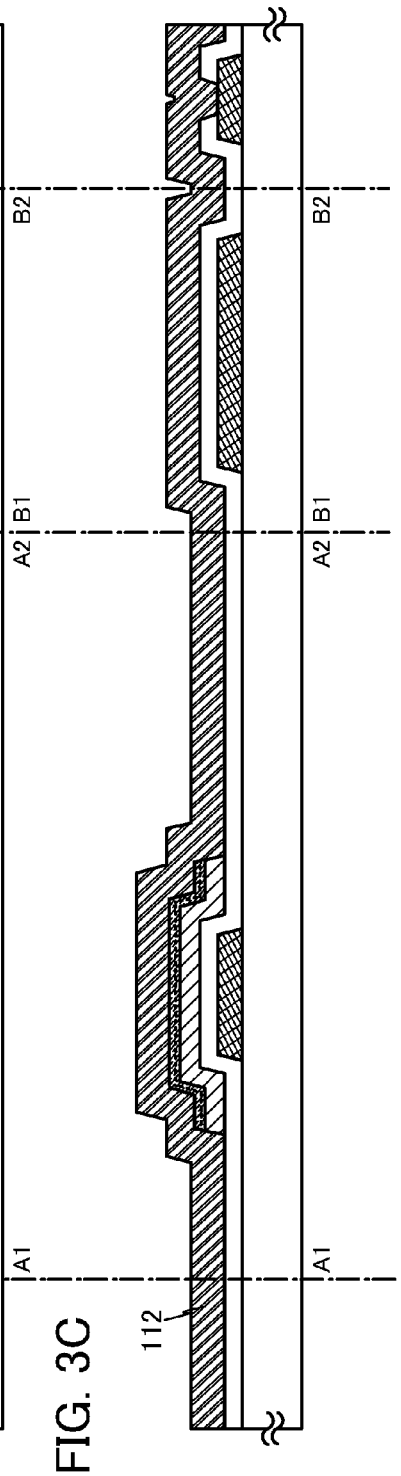

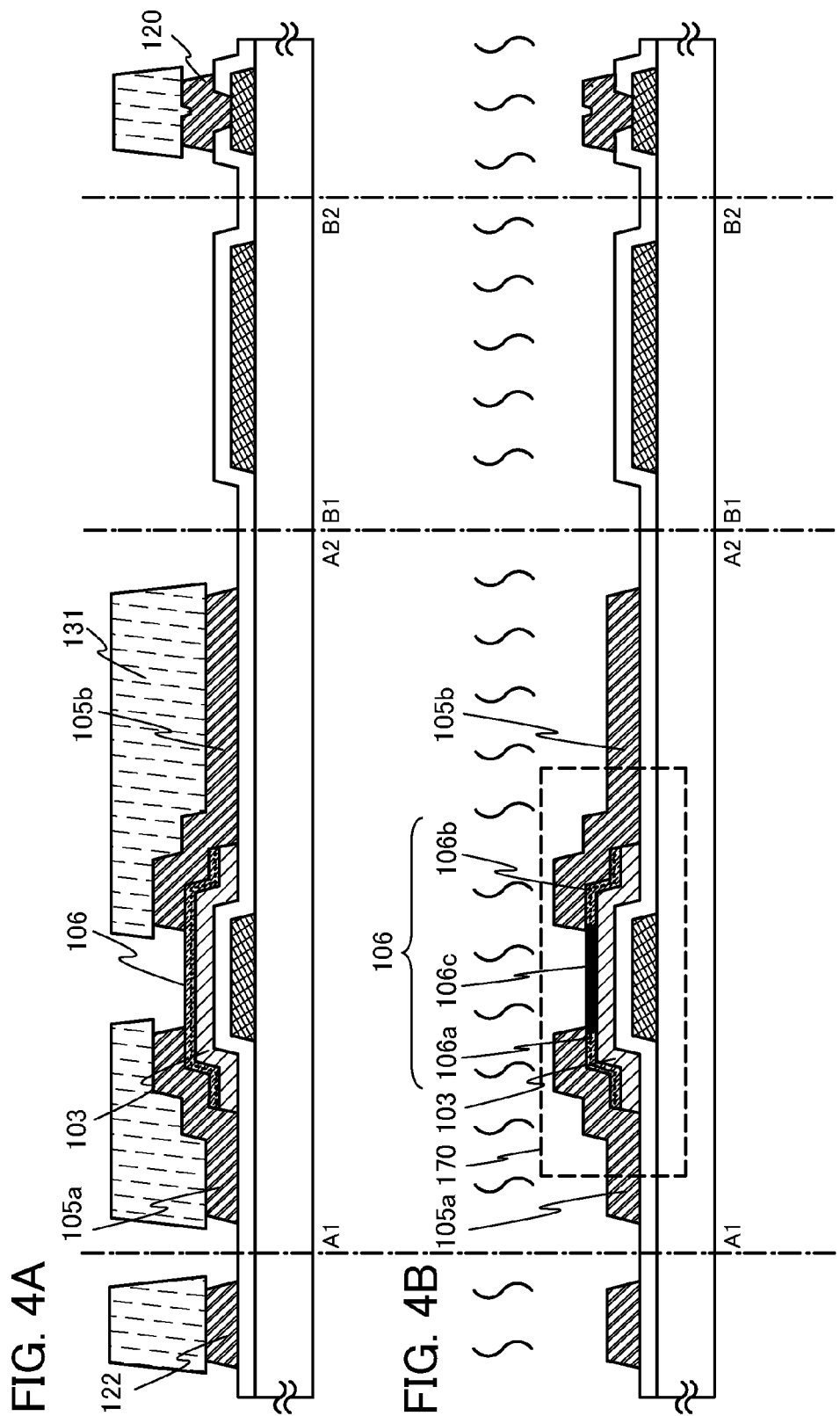

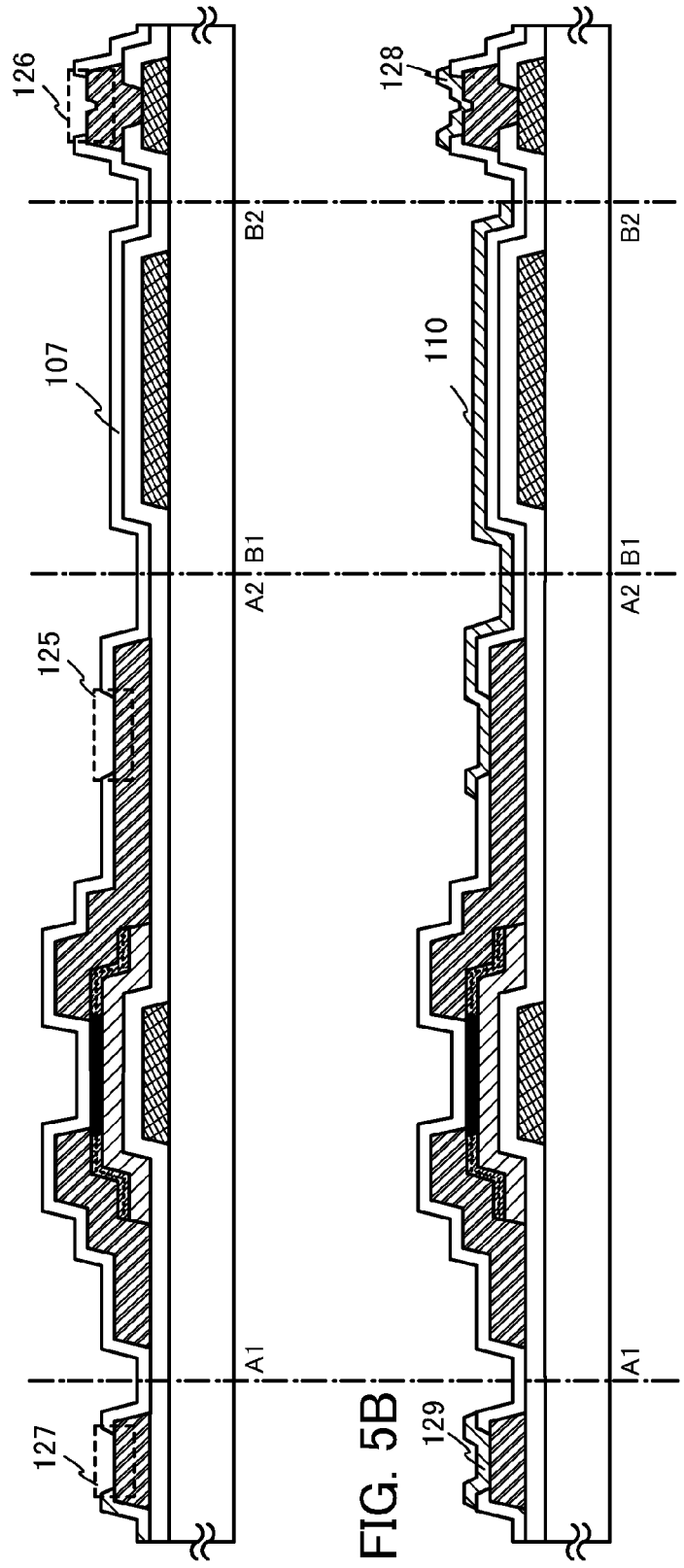

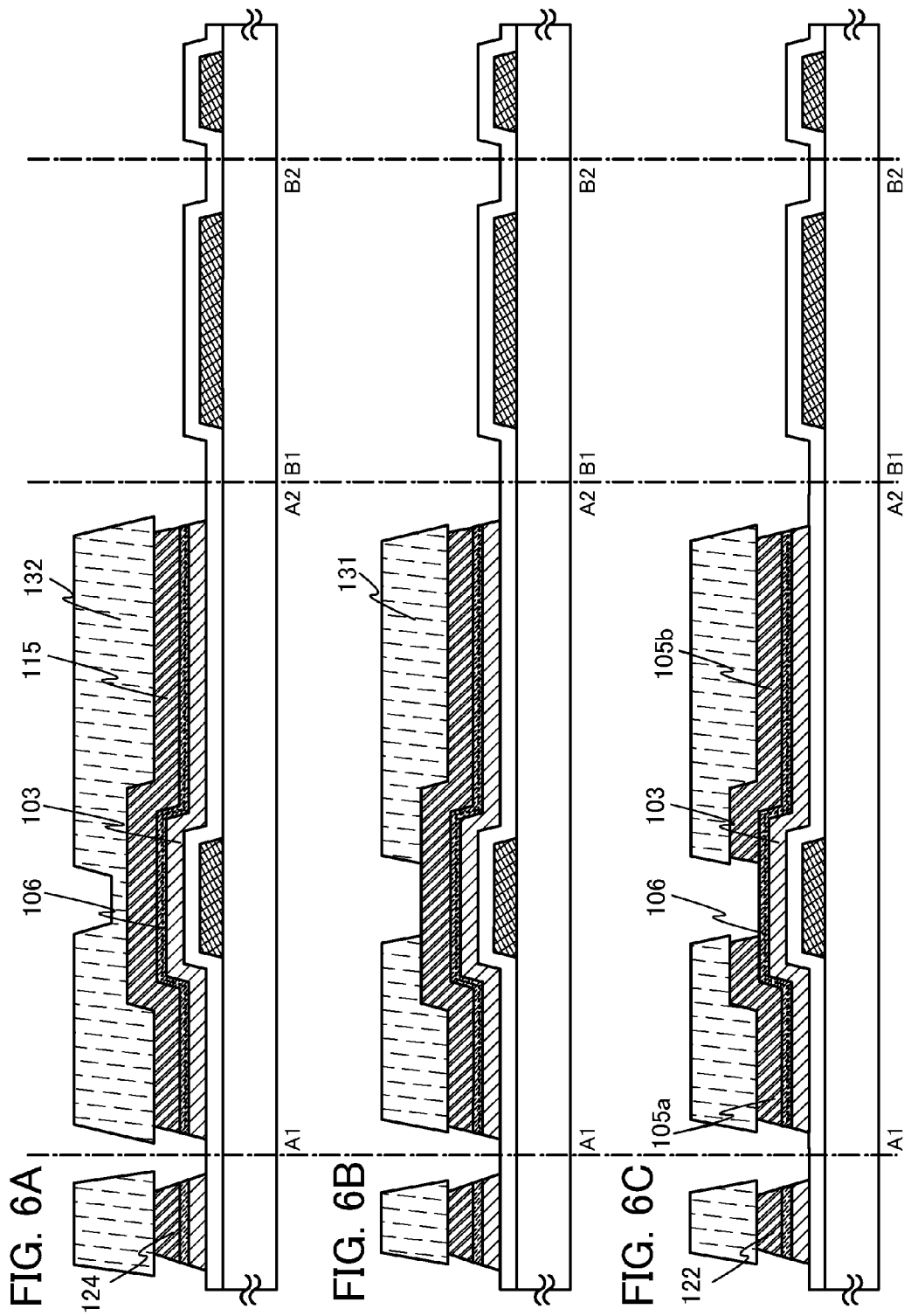

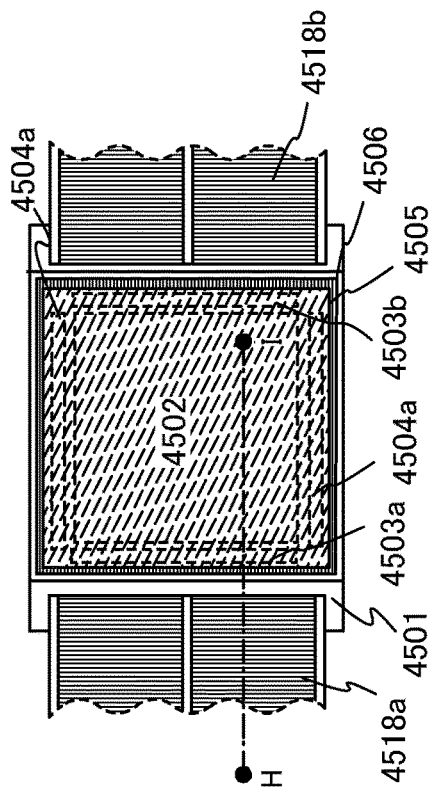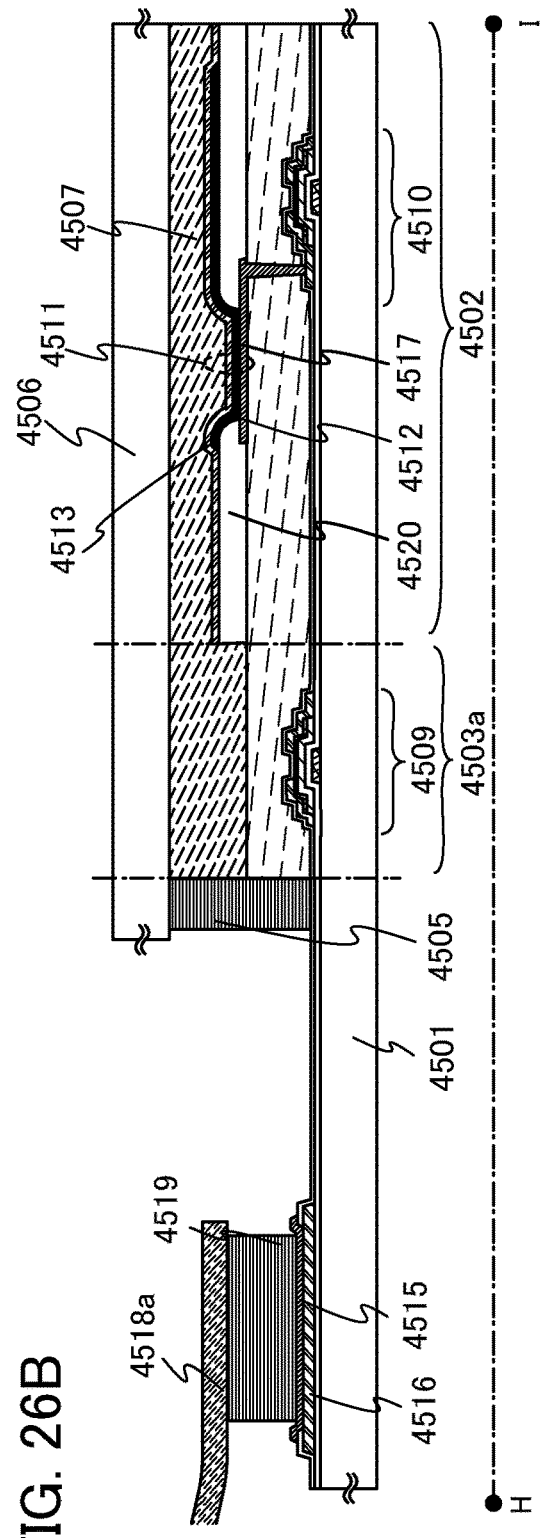
FIG. 26A
FIG. 26B

2631

2632

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor, a display device including the semiconductor device, and a manufacturing method thereof.

2. Description of the Related Art

Various metal oxides are used for a variety of applications. Indium oxide is a well-known material and is used as a light-transmitting electrode material which is necessary for liquid crystal displays and the like.

Some metal oxides have semiconductor characteristics. As metal oxides exhibiting semiconductor characteristics, for example, tungsten oxide, tin oxide, indium oxide, zinc oxide, and the like can be given. References disclose a thin film transistor in which such a metal oxide exhibiting semiconductor characteristics is used for a channel formation region (Patent Documents 1 to 4, and Non-Patent Document 1).

As the metal oxides, not only single-component oxides but also multi-component oxides are known. For example, homologous compound, $InGaO_3(ZnO)_m$ (m is natural number) is known as a multi-component oxide including In, Ga and Zn (Non-Patent Documents 2 to 4).

Further, it is confirmed that such an oxide semiconductor made of In—Ga—Zn-based oxide is applicable to a channel layer of a thin film transistor (Patent Document 5 and Non-Patent Documents 5 and 6).

In a conventional technique, amorphous silicon or polycrystalline silicon has been used for a thin film transistor (a TFT) provided for each pixel of an active matrix liquid crystal display. However, in place of these silicon materials, attention has been attracted to a technique for manufacturing a thin film transistor including the aforementioned metal oxide semiconductor. Examples of the techniques are disclosed in Patent Document 6 and Patent Document 7, in which a thin film transistor is manufactured with zinc oxide or an In—Ga—Zn—O-based oxide semiconductor for a metal oxide semiconductor film and is used as a switching element or the like of an image display device.

REFERENCE

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-96055

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid States Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides (InFeO3(ZnO)m) (m: natural number) and related compounds", KOTAI BUTSURI (SOLID STATE PHYSICS), 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

SUMMARY OF THE INVENTION

An object of an embodiment of the present invention is to provide a thin film transistor using an oxide semiconductor layer, in which contact resistance between the oxide semiconductor layer and source and drain electrode layers is reduced and electric characteristics are stabilized. Another object of an embodiment of the present invention is to provide a method for manufacturing the thin film transistor. Another object of an embodiment of the present invention is to provide a display device including the thin film transistor.

In order to achieve any of the objects, according to an embodiment of the present invention, a thin film transistor using an oxide semiconductor layer is formed in such a manner that a buffer layer including a high-resistance region and low-resistance regions is formed over the oxide semiconductor layer, and the oxide semiconductor layer and the source and drain electrode layers are in contact with each other with the low-resistance regions of the buffer layer interposed therebetween. In addition, in order to achieve any of the objects, according to another embodiment of the present invention, the high-resistance region is formed by heating the buffer layer over the oxide semiconductor layer in the air.

An embodiment of the present invention is a semiconductor device including a gate electrode layer, a gate insulating layer over the gate electrode layer, an oxide semiconductor layer over the gate insulating layer, a buffer layer over the oxide semiconductor layer, and source and drain electrode layers over the buffer layer, in the semiconductor device, the buffer layer includes a low-resistance region and a high-resistance region, conductivity of the low-resistance region is higher than conductivity of the oxide semiconductor layer, the low-resistance region is covered with the source and drain electrode layers, conductivity of the high-resistance region is lower than the conductivity of the low-resistance region, part of the high-resistance region is exposed, and the oxide semiconductor layer and the source and drain electrode layers are electrically connected to each other with the low-resistance region of the buffer layer interposed therebetween.

Note that the buffer layer is preferably formed using a non-single-crystal film formed from an oxide semiconductor. Further, the buffer layer is preferably formed using a non-single-crystal film formed from an oxide semiconductor including nitrogen. Edge portions of the high-resistance region may overlap with the source and drain electrode layers. The width in a channel direction of the gate electrode layer may be smaller than that of the oxide semiconductor layer.

Another embodiment of the present invention is a method for manufacturing a semiconductor device, in which a gate electrode layer is formed over a substrate, a gate insulating layer is formed over the gate electrode layer, a first oxide semiconductor film is formed over the gate insulating layer by a sputtering method, heat treatment is performed on the first oxide semiconductor film in an atmospheric atmosphere, a second oxide semiconductor film is formed over the first oxide semiconductor film by a sputtering method, heat treatment is performed on the second oxide semiconductor film in a nitrogen atmosphere, an oxide semiconductor layer and a buffer layer are formed by etching the first oxide semiconductor film and the second oxide semiconductor film, a conductive film is formed over the oxide semiconductor layer and the buffer layer, source and drain electrode layers are formed by etching the conductive layer, heat treatment is performed on the buffer layer in an atmospheric atmosphere, a low-resistance region whose conductivity is higher than conductivity of the oxide semiconductor layer is formed in part of the buffer layer covered with the source or drain electrode layer, and a high-resistance region whose conductivity is lower than the conductivity of the low-resistance region is formed in an exposed part of the buffer layer.

In addition, the second oxide semiconductor film is preferably formed in an atmosphere of a rare gas and a nitrogen gas. Before the heat treatment in a nitrogen atmosphere, reverse sputtering treatment is preferably performed on the second oxide semiconductor film.

Note that the ordinal numbers such as "first" and "second" in this specification are used for convenience and do not denote the order of steps and the stacking order of layers. In addition, the ordinal numbers in this specification do not denote particular names which specify the present invention.

In this specification, a semiconductor device generally means a device which can function by utilizing semiconductor characteristics, and an electrooptic device, a semiconductor circuit, and electronic equipment are all semiconductor devices.

According to an embodiment of the present invention, in a thin film transistor using an oxide semiconductor layer, the buffer layer including the high-resistance region and the low-resistance regions is formed over the oxide semiconductor layer, the oxide semiconductor layer and the source and drain electrode layers are in contact with each other with the low-resistance regions of the buffer layer interposed therebetween, so that the contact resistance between the oxide semiconductor layer and the source and drain electrode layers can be reduced and electric characteristics can be stabilized. Further, according to an embodiment of the present invention, by heating the buffer layer over the oxide semiconductor layer in the air, the buffer layer including the high-resistance region and the low-resistance regions can be formed.

By using the thin film transistor for a pixel portion and a driver circuit portion of a display device, the display device can have stable electric characteristics and high reliability.

BRIEF DESCRIPTION OF THE DRAWINGS

FIGS. 2A to 2C illustrate a method for manufacturing a semiconductor device according to an embodiment of the present invention;

FIGS. 3A to 3C illustrate the method for manufacturing a semiconductor device according to an embodiment of the present invention;

FIGS. 4A and 4B illustrate the method for manufacturing a semiconductor device according to an embodiment of the present invention;

FIGS. 5A and 5B illustrate the method for manufacturing a semiconductor device according to an embodiment of the present invention;

FIGS. 6A to 6C illustrate a method for manufacturing a semiconductor device according to an embodiment of the present invention;

FIGS. 26A and 26B illustrate a semiconductor device according to an embodiment of the present invention;

Figure 1A:
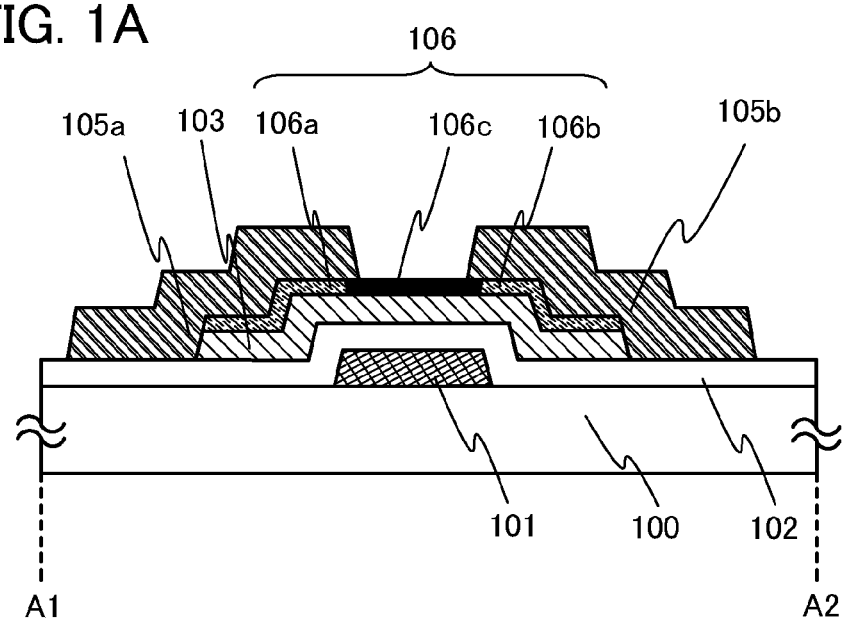
FIGS. 1A and 1B illustrate a semiconductor device according to an embodiment of the present invention.

Embodiments are described in detail with reference to drawings. Note that the present invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

[Embodiment 1]

In this embodiment, a structure of a thin film transistor will be described with reference to FIGS. 1A and 1B.

Figure 1B:
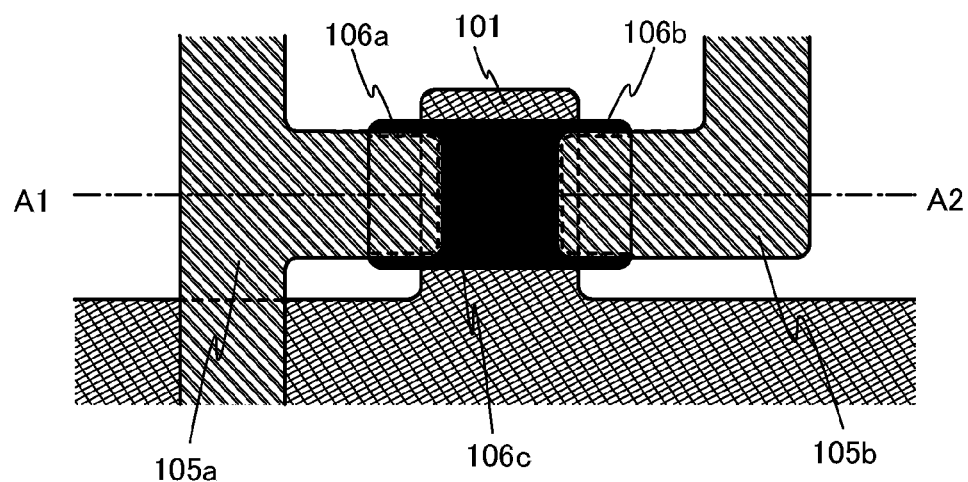
Figure 7:
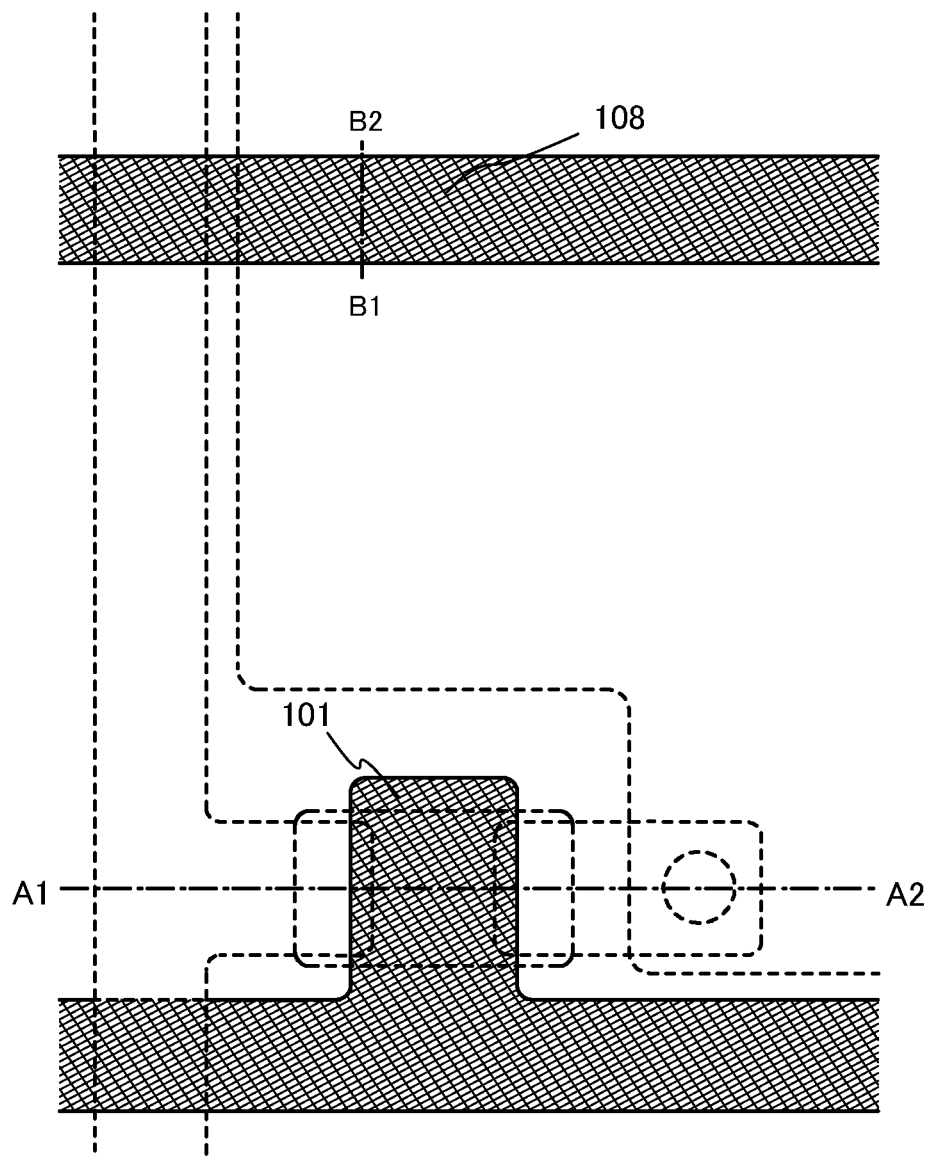
FIG. 7 illustrates the method for manufacturing a semiconductor device according to an embodiment of the present invention.
Figure 8:
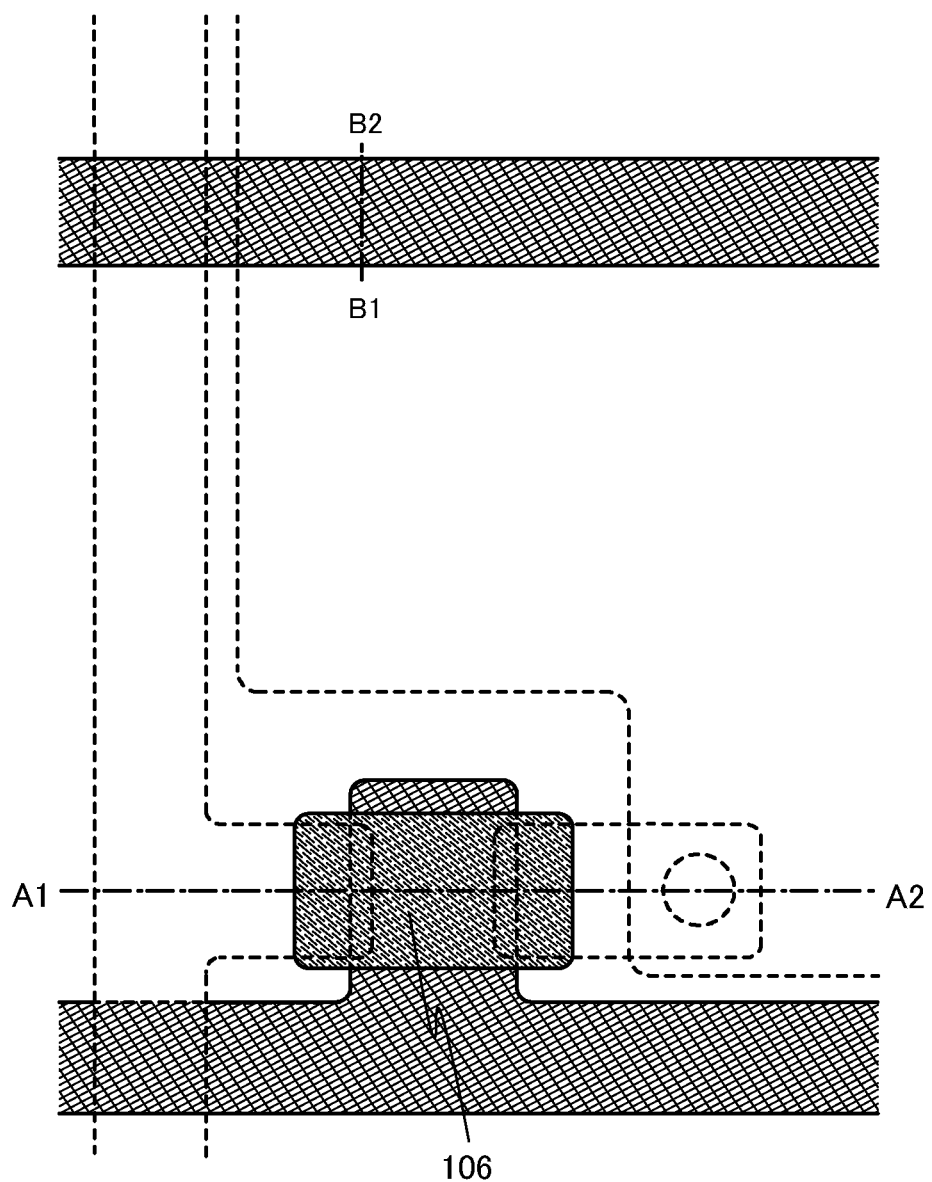
FIG. 8 illustrates the method for manufacturing a semiconductor device according to an embodiment of the present invention.
Figure 9:
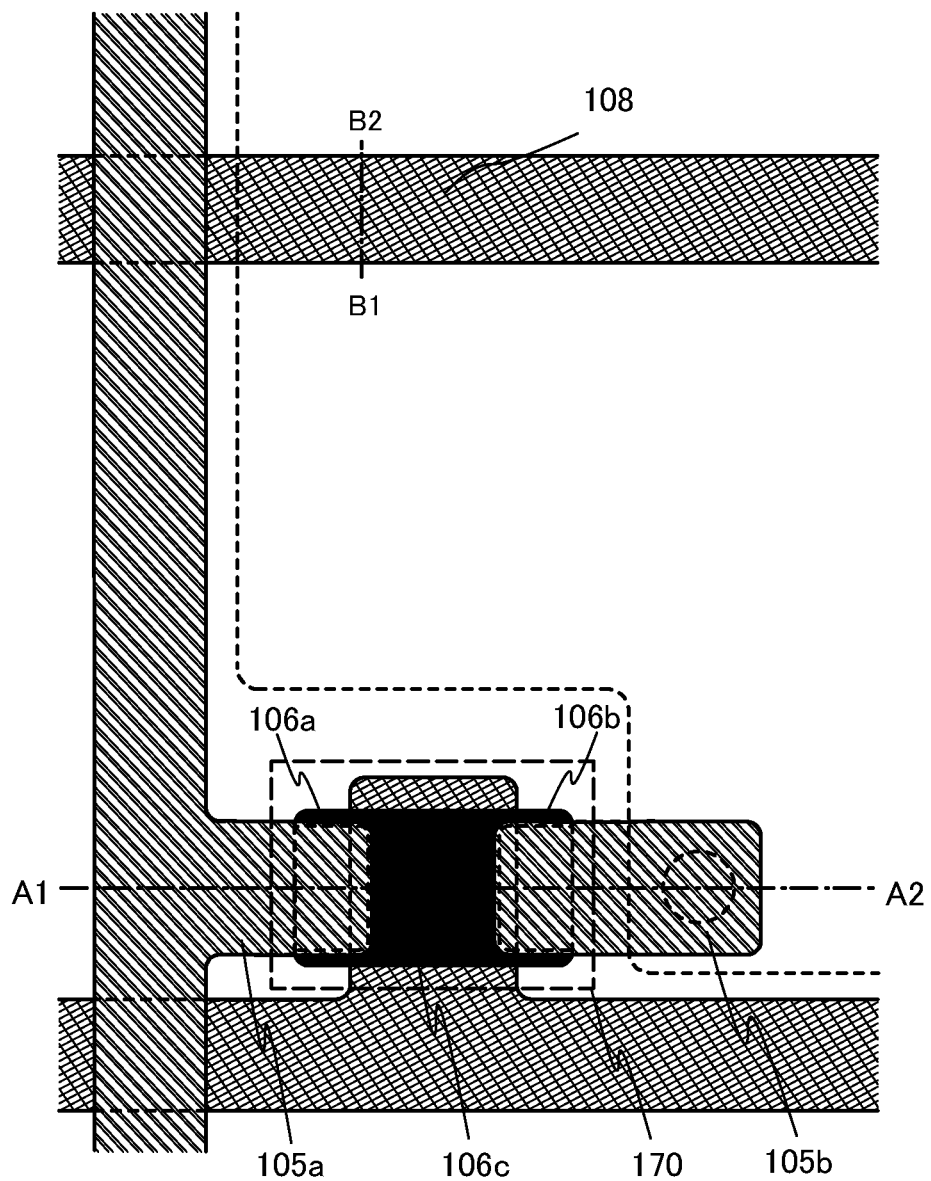
FIG. 9 illustrates the method for manufacturing a semiconductor device according to an embodiment of the present invention.

A thin film transistor having a bottom-gate structure of this embodiment is illustrated in FIGS. 1A and 1B. FIG. 1A is a cross-sectional view, and FIG. 1B is a plan view. FIG. 1A is a cross-sectional view taken along line A1-A2 of FIG. 1B.

In the thin film transistor illustrated in FIGS. 1A and 1B, a gate electrode layer 101 is provided over a substrate 100, a gate insulating layer 102 is provided over the gate electrode layer 101, an oxide semiconductor layer 103 is provided over the gate insulating layer 102, a buffer layer 106 is provided over the oxide semiconductor layer 103, and source and drain electrode layers 105a and 105b are provided over the buffer layer 106. The buffer layer 106 includes a low-resistance region 106a, a low-resistance region 106b, and a high-resistance region 106c. The low-resistance regions 106a and 106b are covered with the source and drain electrode layers 105a and 105b. In other words, the oxide semiconductor layer 103 and the source and drain electrode layers 105a and 105b are electrically connected to each other with the low-resistance regions 106a and 106b of the buffer layer 106 interposed therebetween. On the other hand, edge portions of the high-resistance region 106c overlap with the source and drain electrode layers 105a and 105b, and part of the high-resistance region 106c is exposed without overlapping with the source and drain electrode layers 105a and 105b.

The gate electrode layer 101 can be formed with a single layer or a stacked layer using any of a metal material such as aluminum, copper, molybdenum, titanium, chromium, tantalum, tungsten, neodymium, or scandium; an alloy material including any of the metal materials as its main component; or a nitride including any of the metal materials as its component. The gate electrode layer 101 is preferably formed using a low-resistance conductive material such as aluminum or copper; however, since the low-resistance conductive material has disadvantages such as low heat resistance or a tendency to be corroded, it is preferably used in combination with a heat-resistant conductive material. As the heat-resistant conductive material, molybdenum, titanium, chromium, tantalum, tungsten, neodymium, scandium, or the like is used.

For example, a stacked-layer structure of the gate electrode layer 101 is preferably a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used.

For the oxide semiconductor layer 103, a non-single-crystal film formed from an In—Ga—Zn—O-based, In—Sn—Zn—O-based, Ga—Sn—Zn—O-based, In—Zn—O-based, Sn—Zn—O-based, In—Sn—O-based, Ga—Zn—O-based, In—O-based, Sn—O-based, or Zn—O-based oxide semiconductor.

In this specification, an In—Ga—Zn—O-based oxide semiconductor is an oxide semiconductor including at least In, Ga, and Zn. An In—Sn—Zn—O-based oxide semiconductor is an oxide semiconductor including at least In, Sn, and Zn. A Ga—Sn—Zn—O-based oxide semiconductor is an oxide semiconductor including at least Ga, Sn, and Zn. An In—Zn—O-based oxide semiconductor is an oxide semiconductor including at least In and Zn. A Sn—Zn—O-based oxide semiconductor is an oxide semiconductor including at least Sn and Zn. An In—Sn—O-based oxide semiconductor is an oxide semiconductor including at least In and Sn. A Ga—Zn—O-based oxide semiconductor is an oxide semiconductor including at least Ga and Zn. An In—O-based oxide semiconductor is an oxide semiconductor including at least In. A Sn—O-based oxide semiconductor is an oxide semiconductor including at least Sn. A Zn—O-based oxide semiconductor is an oxide semiconductor including at least Zn. The above oxide semiconductor may include one or more of metal elements of Fe, Ni, Mn, and Co.

As the oxide semiconductor layer 103, an oxide semiconductor film which is formed by a sputtering method in an atmosphere of an oxygen gas and a rare gas such as argon is preferably used. When the oxide semiconductor film is used, the conductivity of the oxide semiconductor layer 103 is reduced and off current can be reduced. In addition, heat treatment is preferably performed on the formed oxide semiconductor film in an atmospheric atmosphere. When heat treatment is performed on an oxide semiconductor in an atmospheric atmosphere, the conductivity of the oxide semiconductor can be reduced. Accordingly, the conductivity of the oxide semiconductor layer 103 can be reduced. Therefore, when the oxide semiconductor layer 103 is used as an active layer of the thin film transistor, off current can be reduced. As the atmospheric atmosphere, an atmosphere including an oxygen gas at 15 vol % to 25 vol % and a nitrogen gas at 75 vol % to 85 vol % is preferably employed.

The oxide semiconductor layer 103 includes at least an amorphous component. A crystal grain (a nanocrystal) is included in an amorphous structure in some cases. The crystal grain (nanocrystal) has a diameter of 1 nm to 10 nm, typically, approximately 2 nm to 4 nm Note that the crystal state is evaluated by X-ray diffraction (XRD) analysis.

The thickness of the oxide semiconductor layer 103 is 10 nm to 300 nm, preferably, 20 nm to 100 nm.

An insulating oxide may be included in the oxide semiconductor layer 103. Here, as the insulating oxide, silicon oxide is preferable. Further, nitrogen may be added to the insulating oxide. In this case, the oxide semiconductor layer 103 is preferably formed by a sputtering method using a target including $SiO_2$ at 0.1% by weight to 30% by weight inclusive, more preferably at 1% by weight to 10% by weight inclusive.

By inclusion of the insulating oxide such as silicon oxide in the oxide semiconductor layer 103, crystallization of the oxide semiconductor layer 103 can be suppressed and the oxide semiconductor layer 103 can have an amorphous structure. Crystallization of the oxide semiconductor layer 103 is suppressed and the oxide semiconductor layer 103 has an amorphous structure, whereby variation in characteristics of the thin film transistor can be reduced and the characteristics of the thin film transistor can be stabilized. Further, by inclusion the insulating oxide such as silicon oxide in the oxide semiconductor layer 103, crystallization of the oxide semiconductor layer 103 or generation of a microcrystalline grain in the oxide semiconductor layer 103 can be suppressed even when heat treatment is performed at 300° C. to 600° C.

In a manner similar to the case of the oxide semiconductor layer 103, the buffer layer 106 can be formed using a non-single-crystal film formed from an In—Ga—Zn—O-based, In—Sn—Zn—O-based, Ga—Sn—Zn—O-based, In—Zn—O-based, Sn—Zn—O-based, In—Sn—O-based, Ga—Zn—O-based, In—O-based, Sn—O-based, or Zn—O-based oxide semiconductor. In addition, the buffer layer 106 is preferably formed using a non-single-crystal film formed from an In—Ga—Zn—O—N-based, Ga—Zn—O—N-based, Zn—O—N-based, or Sn—Zn—O—N-based oxide semiconductor, which includes nitrogen. In addition, the non-single-crystal film may include insulating oxide such as silicon oxide.

In this specification, an In—Ga—Zn—O—N-based oxide semiconductor is an oxide semiconductor including at least In, Ga, Zn, and N. A Ga—Zn—O—N-based oxide semiconductor is an oxide semiconductor including at least Ga, Zn, and N. A Zn—O—N-based oxide semiconductor is an oxide semiconductor including at least Zn and N. A Sn—Zn—O—N-based oxide semiconductor is an oxide semiconductor including at least Sn, Zn, and N.

The buffer layer 106 includes the low-resistance regions 106a and 106b which function as source and drain regions and the high-resistance region 106c. The conductivity of the low-resistance regions 106a and 106b is higher than that of the oxide semiconductor layer 103, and the conductivity of the high-resistance region 106c is lower than that of the low-resistance regions 106a and 106b.

The buffer layer 106 is formed from a non-single-crystal film of the oxide semiconductor having low resistance. It is preferable that after the source and drain electrode layers 105a and 105b are formed, the resistance of part of the buffer layer 106 is increased by performing heat treatment in an atmospheric atmosphere, so that the high-resistance region 106c is formed. Here, in part of the buffer layer 106 other than the high-resistance region 106c, the low-resistance regions 106a and 106b which have relative low conductivity compared to the high-resistance region 106c are provided. In the case where the oxide semiconductor film, which is used for the buffer layer 106, is formed in an atmosphere of a rare gas such as argon and a nitrogen gas by a sputtering method, the conductivity of the low-resistance regions 106a and 106b can be increased. In addition, when reverse sputtering treatment and/or heat treatment in a nitrogen atmosphere is performed on the formed oxide semiconductor film, the conductivity of the low-resistance regions 106a and 106b can be further increased. Here, an atmosphere including a nitrogen gas at 80 vol % to 100 vol % and a rare gas such as an argon gas at 0 vol % to 20 vol % is preferably employed as the nitrogen atmosphere.

In addition, in the low-resistance regions 106a and 106b, the conductivity may be changed in stages or successively from a surface toward an inside of the buffer layer 106.

The buffer layer 106 includes at least an amorphous component. A crystal grain (a nanocrystal) is included in an amorphous structure in some cases. The crystal grain (nanocrystal) has a diameter of 1 nm to 10 nm, typically, about 2 nm to 4 nm. Note that the crystal state is evaluated by X-ray diffraction (XRD) analysis.

The thickness of the oxide semiconductor film used for the buffer layer 106 is 5 nm to 20 nm. Needless to say, when the film includes a crystal grain, the diameter of the crystal grain does not exceed the thickness of the film.

When the buffer layer 106 including the low-resistance regions 106a and 106b and the high-resistance region 106c is formed over the oxide semiconductor layer 103, the oxide semiconductor layer 103 and the source and drain electrode layers 105a and 105b can be in contact with each other with the low-resistance regions 106a and 106b interposed therebetween. Thus, contact resistance is reduced by forming an ohmic contact between the oxide semiconductor layer 103 and the source and drain electrode layers 105a and 105b and electric characteristics of the thin film transistor can be stabilized. By provision of the high-resistance region 106c between the low-resistance regions 106a and 106b, off current which flows between the low-resistance regions 106a and 106b can be reduced. In addition, by provision of the buffer layer 106, when the source and drain electrode layers are formed by etching, generation of excess carriers which are caused by oxygen vacancy due to plasma damage to the oxide semiconductor layer 103 can be suppressed.

The source and drain electrode layers 105a and 105b can be formed using a metal material such as aluminum, copper, molybdenum, titanium, chromium, tantalum, tungsten, neodymium, or scandium; an alloy material including any of the metal materials as its main component; or nitride including any of the metal materials as its component. The source and drain electrode layers 105a and 105b are preferably formed using a low-resistance conductive material such as aluminum or copper; however, since the low-resistance conductive material has disadvantages such as low heat resistance or a tendency to be corroded, it is preferably used in combination with a heat-resistant conductive material. As the heat-resistant conductive material, molybdenum, titanium, chromium, tantalum, tungsten, neodymium, scandium, or the like is used.

For example, it is preferable that the source and drain electrode layers 105a and 105b are formed with a three-layer structure in which a first conductive layer and a third conductive layer are formed using titanium that is a heat-resistant conductive material, and a second conductive layer is formed using an aluminum alloy including neodymium that has low resistance. By employing such a structure for the source and drain electrode layers 105a and 105b, generation of a hillock can be reduced while low resistance of aluminum is utilized. Note that the structure of the source and drain electrode layers 105a and 105b is not limited thereto. Alternatively, a single-layer structure, a two-layer structure, or a structure of four or more layers may be employed.

Figure 13A:
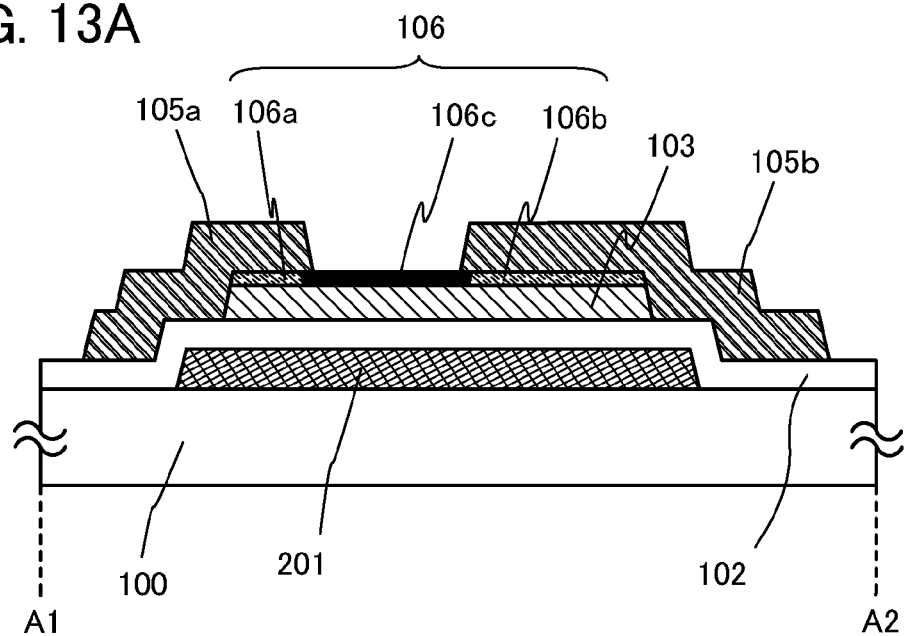
FIGS. 13A and 13B illustrate a semiconductor device according to an embodiment of the present invention.
Figure 13B:
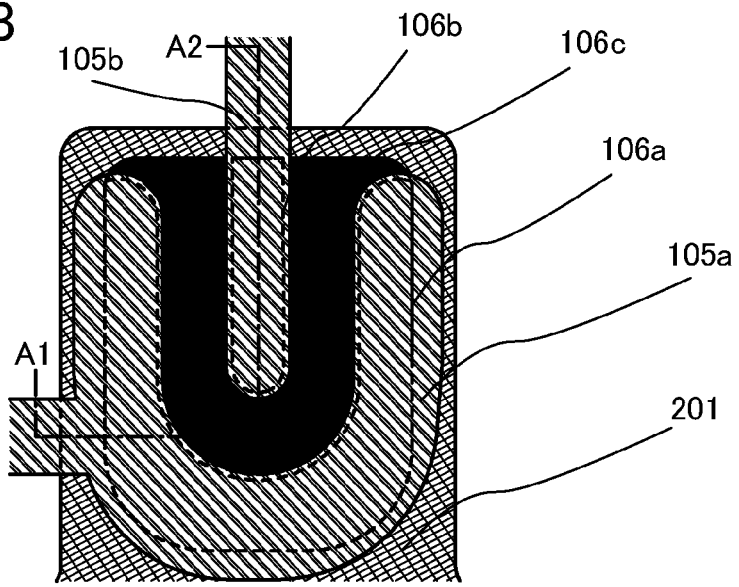

Further, although the thin film transistor having an inverted staggered structure illustrated in FIGS. 1A and 1B has the gate electrode layer 101 having a width in a channel direction, which is smaller than that of the oxide semiconductor layer 103, the thin film transistor described in this embodiment is not limited thereto. As illustrated in FIGS. 13A and 13B, a gate electrode layer 201 having a width in a channel direction, which is larger than that of the oxide semiconductor layer 103 may be used. Note that FIG. 13A is a cross-sectional view taken along line A1-A2 in FIG. 13B. By employing such a structure, the oxide semiconductor layer 103 can be protected from light by the gate electrode layer 201. Thus, reliability of the thin film transistor can be improved. Note that except the gate electrode layer 201, reference numerals of parts of the thin film transistor illustrated in FIGS. 13A and 13B are the same as those used for the thin film transistor illustrated in FIGS. 1A and 1B.

As described above, in the thin film transistor using the oxide semiconductor layer, the buffer layer including the high-resistance region and the low-resistance regions is formed over the oxide semiconductor layer, and the oxide semiconductor layer and the source and drain electrode layers are in contact with each other with the low-resistance regions of the buffer layer interposed therebetween, whereby the contact resistance between the oxide semiconductor layer and the source and drain electrode layers can be reduced and electric characteristics can be stabilized.

Note that the structure described in this embodiment can be combined with any of the structures described in other embodiments as appropriate.

[Embodiment 2]

In this embodiment, a manufacturing process of a display device including the thin film transistor described in Embodiment 1 will be described with reference to FIGS. 2A to 2C, FIGS. 3A to 3C, FIGS. 4A and 4B, FIGS. 5A and 5B, FIGS. 6A to 6C, FIG. 7, FIG. 8, FIG. 9, FIG. 10, and FIG. 11. FIGS. 2A to 2C, FIGS. 3A to 3C, FIGS. 4A and 4B, FIGS. 5A and 5B, and FIGS. 6A to 6C are cross-sectional views and FIG. 7, FIG. 8, FIG. 9, FIG. 10, and FIG. 11 are plan views. Note that A1-A2 and B1-B2 of FIGS. 2A to 2C, FIGS. 3A to 3C, FIGS. 4A and 4B, FIGS. 5A and 5B, and FIGS. 6A to 6C correspond to cross sections taken along lines A1-A2 and B1-B2 of FIG. 7, FIG. 8, FIG. 9, FIG. 10, and FIG. 11, respectively.

First, the substrate 100 is prepared. As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a heat-resistant plastic substrate that can resist a process temperature of this manufacturing process; or the like. Alternatively, a metal substrate such as a stainless steel alloy substrate which is provided with an insulating film over the surface may also be used. As the substrate 100, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

Further, an insulating film may be provided as a base film over the substrate 100. The base film may be formed with a single layer or a stacked layer using any of a silicon oxide film, a silicon nitride film, a silicon oxynitride film, and a silicon nitride oxide film by a CVD method, a sputtering method, or the like. In the case where a substrate including mobile ions, such as a glass substrate, is used as the substrate 100, a film including nitrogen such as a silicon nitride film or a silicon nitride oxide film is used as the base film, whereby the mobile ions can be prevented from entering the oxide semiconductor layer.

A conductive film to be a gate wiring including the gate electrode layer 101, a capacitor wiring 108, and a first terminal 121 is formed over the entire surface of the substrate 100 by a sputtering method or a vacuum evaporation method. Next, a photolithography process is performed and a resist mask is formed. Then, unnecessary portions are removed by etching, whereby wirings and an electrode (the gate wiring including the gate electrode layer 101, the capacitor wiring 108, and the first terminal 121) are formed. At this time, etching is preferably performed so that at least an end portion of the gate electrode layer 101 can have a tapered shape in order to prevent disconnection. A cross-sectional view at this stage is illustrated in FIG. 2A. Note that a top view at this stage corresponds to FIG. 7.

The gate wiring including the gate electrode layer 101, the capacitor wiring 108, and the first terminal 121 in a terminal portion can be formed with a single layer or a stacked layer using the conductive material described in Embodiment 1.

Here, the gate electrode layer 101 may be formed so that the width in a channel direction of the gate electrode layer 101 is larger than that of the oxide semiconductor layer 103 which is to be formed in a later step. By forming the gate electrode layer 101 in this manner, such a thin film transistor illustrated in FIGS. 13A and 13B can be formed. In such a transistor illustrated in FIGS. 13A and 13B, the oxide semiconductor layer 103 can be protected from light by the gate electrode layer 201.

Next, a gate insulating layer 102 is formed over the entire surface of the gate electrode layer 101, the capacitor wiring 108, and the first terminal 121. The gate insulating layer 102 is formed to a thickness of 50 nm to 250 nm by a CVD method, a sputtering method, or the like.

For example, the gate insulating layer 102 is formed to a thickness of 100 nm using a silicon oxide film by a CVD method or a sputtering method. Needless to say, the gate insulating layer 102 is not limited to such a silicon oxide film, and other insulating films such as a silicon oxynitride film, a silicon nitride oxide film, a silicon nitride film, an aluminum oxide film, or a tantalum oxide film may be used to form a single-layer structure or a stacked-layer structure.

Alternatively, the gate insulating layer 102 can be formed using a silicon oxide layer by a CVD method using an organosilane gas. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Alternatively, the gate insulating layer 102 may be formed using one kind of oxide, nitride, oxynitride, and nitride oxide of aluminum, yttrium, or hafnium; or a compound including at least two or more kinds thereof.

Note that in this specification, oxynitride refers to a substance that includes more oxygen atoms than nitrogen atoms and nitride oxide refers to a substance that includes more nitrogen atoms than oxygen atoms. For example, a silicon oxynitride film means a film that includes more oxygen atoms than nitrogen atoms, and oxygen, nitrogen, silicon, and hydrogen at concentrations of 50 at. % to 70 at. %, 0.5 at. % to 15 at. %, 25 at. % to 35 at. %, and 0.1 at. % to 10 at. %, respectively, when they are measured by RBS (Rutherford Backscattering Spectrometry) and HFS (Hydrogen Forward Scattering). Further, a silicon nitride oxide film means a film that includes more nitrogen atoms than oxygen atoms and, in the case where measurements are performed using RBS and HFS, includes oxygen, nitrogen, silicon, and hydrogen at concentrations of 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Note that before an oxide semiconductor film to be the oxide semiconductor layer 103 is formed, reverse sputtering by which plasma is generated by introduction of an argon gas into a chamber where the substrate 100 is placed is preferably performed to remove powder substances (also referred to as particles or dust) which are generated at the time of film formation and attached to a surface of the gate insulating layer. By reverse sputtering, planarity of the surface of the gate insulating layer 102 can be improved. The reverse sputtering refers to a method in which, without application of voltage to a target side, an RF power source is used for application of voltage to a substrate side in an argon atmosphere and plasma is generated around the substrate to modify a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used. After the reverse sputtering treatment, a first oxide semiconductor film 111 is formed without exposure to the air, whereby dust or moisture can be prevented from attaching to an interface between the gate insulating layer 102 and the oxide semiconductor layer 103.

Next, the first oxide semiconductor film 111 to be the oxide semiconductor layer 103 is formed over the gate insulating layer 102 by a sputtering method in an atmosphere of an oxygen gas and a rare gas such as an argon gas. Alternatively, the film formation may be performed in an atmosphere including only a rare gas such as an argon gas without an oxygen gas. As the first oxide semiconductor film 111, the oxide semiconductor to be the oxide semiconductor layer 103, which is described in Embodiment 1, can be used. Specifically, for example, the film formation is performed by sputtering with the use of an oxide semiconductor target including In, Ga, and Zn ($In_2O_3$:$Ga_2O_3$:ZnO=1:1:1) of 8 inches in diameter, under the conditions that the distance between the substrate and the target is 60 mm, the pressure is 0.4 Pa, the direct current (DC) power is 0.5 kW, the flow rate ratio of Ar: $O_2$ in a deposition gas is 30:15 (sccm), and the deposition temperature is room temperature. As the target, $Ga_2O_3$ and ZnO in a pellet state may be disposed on a disk of 8 inches in diameter which includes $In_2O_3$. Note that a pulse direct current (DC) power source is preferable because powder substances (also referred to as particles or dust) generated in film formation can be reduced and the film thickness can be uniform. The thickness of the first oxide semiconductor film 111 is set to 10 nm to 300 nm, preferably 20 nm to 100 nm.

The target may include insulating oxide so that the first oxide semiconductor film 111 includes insulating oxide. Here, as the insulating oxide, silicon oxide is preferable. Further, nitrogen may be added to the insulating oxide. When the first oxide semiconductor film 111 is formed, it is preferable to use an oxide semiconductor target including $SiO_2$ at 0.1% by weight to 30% by weight inclusive, preferably at 1% by weight to 10% by weight inclusive.

The first oxide semiconductor film 111 includes insulating oxide such as silicon oxide, whereby the oxide semiconductor to be formed is made amorphous easily. In addition, by inclusion of insulating oxide such as silicon oxide, crystallization of the oxide semiconductor layer 103 can be suppressed when heat treatment is performed on the oxide semiconductor in a later step.

A chamber used for forming the first oxide semiconductor film 111 may be the same or different from the chamber in which the reverse sputtering has been performed.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which voltage is also applied to a substrate during deposition.

Next, heat treatment is performed on the first oxide semiconductor film 111 in an atmospheric atmosphere. The heat treatment is performed at 200° C. to 600° C. inclusive, preferably 250° C. to 500° C. inclusive. For example, the heat treatment is performed on the substrate 100 set in a furnace in an atmospheric atmosphere at 350° C. for about one hour. By the heat treatment on the oxide semiconductor in an atmospheric atmosphere, the conductivity of the oxide semiconductor can be reduced. Accordingly, the conductivity of the first oxide semiconductor film 111 (the oxide semiconductor layer 103) can be reduced. Therefore, when the oxide semiconductor layer 103 is used as an active layer of the thin film transistor, off current can be reduced. In addition, when the buffer layer 106 is formed in a later step, the conductivity of the buffer layer 106 is increased by heating the buffer layer 106 in a nitrogen atmosphere. At this time, the conductivity of the first oxide semiconductor film 111 is also increased. However, by performing the heat treatment in advance on the first oxide semiconductor film 111 in an atmospheric atmosphere, increase of the conductivity of the first oxide semiconductor film 111 can be suppressed. Here, an atmosphere including an oxygen gas at 15 vol % to 25 vol % and a nitrogen gas at 75 vol % to 85 vol % is preferably employed for the atmospheric atmosphere. A cross-sectional view at this stage is illustrated in FIG. 2B.

Next, a second oxide semiconductor film 113 to be the buffer layer 106 is formed over the first oxide semiconductor film 111 by a sputtering method in an atmosphere of a rare gas such as an argon gas. It is preferable that the second oxide semiconductor film 113 is formed by a sputtering method in an atmosphere of a rare gas such as an argon gas and a nitrogen gas. As a result, the conductivity of the buffer layer 106 can be increased. Alternatively, the film formation may be performed in an atmosphere of a rare gas such as an argon gas and an oxygen gas under the condition that the flow rate of a rare gas such as an argon gas is higher than that of an oxygen gas. As the second oxide semiconductor film 113, the oxide semiconductor to be the buffer layer 106, which is described in Embodiment 1, can be used. Specifically, for example, the film formation is performed by sputtering with the use of an oxide semiconductor target including In, Ga, and Zn ($In_2O_3$:$Ga_2O_3$:ZnO=1:1:1) of 8 inches in diameter, under the conditions that the distance between the substrate and the target is 60 mm, the pressure is 0.4 Pa, the direct current (DC) power is 0.5 kW, the flow rate ratio of Ar to $N_2$ in a deposition gas is 35:5 (sccm), and the deposition temperature is room temperature. As the target, $Ga_2O_3$ and ZnO in a pellet state may be disposed on a disk of 8 inches in diameter which includes $In_2O_3$. Note that a pulse direct current (DC) power source is preferable because powder substances (also referred to as particles or dust) generated in film formation can be reduced and the film thickness can be uniform. The thickness of the second oxide semiconductor film 113 is set to 5 nm to 20 nm.

In a manner similar to the case of the first oxide semiconductor film 111, the target may include insulating oxide so that the second oxide semiconductor film 113 includes insulating oxide. Here, as the insulating oxide, silicon oxide is preferable. Further, nitrogen may be added to the insulating oxide.

A chamber used for forming the second oxide semiconductor film 113 may be the same or different from the chamber in which the first oxide semiconductor film 111 has been formed. In addition, in formation of the second oxide semiconductor film 113, the same sputtering apparatus as that for forming the first oxide semiconductor film 111 can be used.

The second oxide semiconductor film 113 is preferably subjected to reverse sputtering treatment. By the reverse sputtering of the second oxide semiconductor film 113, the conductivity of the second oxide semiconductor film 113 can be increased. For example, an argon gas is introduced at a pressure of 0.6 Pa and a gas flow rate of approximately 50 sccm into the chamber where the substrate 100 is set and reverse sputtering treatment is performed for approximately 3 minutes. Here, since the reverse sputtering treatment greatly affects a surface of the second oxide semiconductor film 113, the second oxide semiconductor film 113 has a structure in which the conductivity is changed in stages or successively from the surface toward an inside of the second oxide semiconductor film 113 in some cases.

The substrate 100 is preferably processed without being exposed to the air during the period from the formation of the second oxide semiconductor film 113 up to the reverse sputtering treatment. Note that a chamber used for the reverse sputtering treatment may be the same or different from the chamber in which the second oxide semiconductor film 113 has been formed. The reverse sputtering treatment may be performed after heat treatment in a nitrogen atmosphere performed next. A cross-sectional view at this stage is illustrated in FIG. 2C. A portion above a dashed line in the second oxide semiconductor film 113 is a mark of the reverse sputtering treatment.

Next, heat treatment is performed on the second oxide semiconductor film 113 in a nitrogen atmosphere. The heat treatment is performed at 200° C. to 600° C. inclusive, preferably 250° C. to 500° C. inclusive. For example, the heat treatment is performed on the substrate 100 set in a furnace in a nitrogen atmosphere at 350° C. for about one hour. By the heat treatment on the oxide semiconductor in a nitrogen atmosphere, the conductivity of the oxide semiconductor can be increased. Accordingly, the conductivity of the second oxide semiconductor film 113 (buffer layer 106) can be increased and the low-resistance regions 106a and 106b of the buffer layer 106 can be formed. At this time, since the first oxide semiconductor film 111 is subjected to the heat treatment in an atmospheric atmosphere as described above, increase of the conductivity of the first oxide semiconductor film 111 can be suppressed. Here, an atmosphere including a nitrogen gas at 80 vol % to 100 vol % and a rare gas such as an argon gas at 0 vol % to 20 vol % is preferably employed for the nitrogen atmosphere. The heat treatment in a nitrogen atmosphere progresses from a surface toward an inside of the second oxide semiconductor film 113. Therefore, the second oxide semiconductor film 113 may have a structure in which the conductivity is changed in stages or successively from the surface toward the inside of the second oxide semiconductor film 113 in some cases. In particular, when time for the heat treatment in a nitrogen atmosphere is not enough, difference in the conductivity between the surface and the inside of the second oxide semiconductor film 113 becomes large in some cases. A cross-sectional view at this stage is illustrated in FIG. 3A.

Next, a photolithography process is performed and a resist mask is formed. Then, the first oxide semiconductor film 111 and the second oxide semiconductor film 113 are etched. An acid-based etchant can be used for an etchant for the etching. Here, unnecessary portions are removed by wet etching using a mixed solution of phosphoric acid, acetic acid, nitric acid, and pure water (referred to as an aluminum mixed acid) so that the first oxide semiconductor film 111 and the second oxide semiconductor film 113 have an island shape. Thus, the oxide semiconductor layer 103 and the buffer layer 106 are formed. The oxide semiconductor layer 103 and the buffer layer 106 are etched to have a tapered edge, whereby disconnection of a wiring due to a step shape can be prevented.

Note that etching here is not limited to wet etching and dry etching may also be employed. As an etching apparatus used for the dry etching, an etching apparatus using a reactive ion etching method (an RIE method), or a dry etching apparatus using a high-density plasma source such as ECR (electron cyclotron resonance) or ICP (inductively coupled plasma) can be used. As a dry etching apparatus by which uniform electric discharge can be obtained over a wide area as compared to an ICP etching apparatus, there is an ECCP (enhanced capacitively coupled plasma) mode etching apparatus in which an upper electrode is grounded, a high-frequency power source at 13.56 MHz is connected to a lower electrode, and further a low-frequency power source at 3.2 MHz is connected to the lower electrode. This ECCP mode etching apparatus can be applied, for example, even when a substrate of the tenth generation with a side of longer than 3 m is used. A cross-sectional view at this stage is illustrated in FIG. 3B. Note that a plan view at this stage corresponds to FIG. 8.

Next, a photolithography process is performed and a resist mask is formed. Then, unnecessary portions of the gate insulating layer 102 are removed by etching, whereby a contact hole reaching the wiring or the electrode layer which is formed from the same material as the gate electrode layer 101 is formed. The contact hole is provided for direct connection with a conductive film to be formed later. For example, a contact hole is formed when a thin film transistor whose gate electrode layer is in direct contact with the source or drain electrode layer in the driver circuit portion is formed, or when a terminal that is electrically connected to a gate wiring of a terminal portion is formed.

Next, a conductive film 112 formed from a metal material is formed by a sputtering method or a vacuum evaporation method over the oxide semiconductor layer 103, the buffer layer 106, and the gate insulating layer 102. A cross-sectional view at this stage is illustrated in FIG. 3C.

The conductive film 112 can be formed with a single layer or a stacked layer using the conductive material described in Embodiment 1. For example, in the conductive film 112, a first conductive layer and a third conductive layer may be formed using titanium that is a heat-resistant conductive material, and a second conductive layer may be formed using an aluminum alloy including neodymium. The conductive film 112 has such a structure, whereby low resistance of aluminum is utilized and generation of hillocks can be reduced.

Next, a photolithography process is performed and a resist mask 131 is formed. Then, unnecessary portions are removed by etching, whereby source and drain electrode layers 105a and 105b and a connection electrode 120 are formed. Wet etching or dry etching is employed as an etching method at this time. For example, when in the conductive film 112, the first and third conductive layers are formed using titanium and the second conductive layer is formed using an aluminum alloy containing neodymium, wet etching can be performed using a hydrogen peroxide solution, heated hydrochloric acid, or a nitric acid solution including ammonium fluoride as an etchant. For example, the conductive film 112 including the first conductive layer, the second conductive layer, and the third conductive layer can be etched collectively with the use of KSMF-240 (manufactured by Kanto Chemical Co., Inc.). In this etching step, part of an exposed portion of the buffer layer 106 is etched in some cases. A cross-sectional view at this stage is illustrated in FIG. 4A. Note that, in FIG. 4A, since wet etching allows the layers to be etched isotropically, the edge portions of the source and drain electrode layers 105a and 105b are recessed from the resist mask 131.

Further, in this photolithography process, a second terminal 122 formed from the same material as that of the source and drain electrode layers 105a and 105b is left in the terminal portion. Note that the second terminal 122 is electrically connected to a source wiring (a source wiring including the source and drain electrode layers 105a and 105b).

In the terminal portion, the connection electrode 120 is directly connected to the first terminal 121 in the terminal portion through the contact hole formed in the gate insulating film. Note that although not illustrated here, a source wiring or a drain wiring, and a gate electrode of the thin film transistor in the driver circuit are directly connected through the same steps as the above-described steps.

In the above photolithography process, two masks are necessary in a step where the oxide semiconductor layer 103 and the buffer layer 106 are etched to have an island shape and a step where the source and drain electrode layers 105a and 105b are formed. However, with the use of a resist mask having regions with plural thicknesses (typically, two different thicknesses) which is formed using a multi-tone (high-tone) mask, the number of resist masks can be reduced, resulting in a simplified process and lower costs. A photolithography process using a multi-tone mask is described with reference to FIGS. 6A to 6C.

First, starting from the state illustrated in FIG. 3A, a conductive film 112 is formed over the second oxide semiconductor film. Then, a resist mask 132 having regions with a plurality of different thicknesses is formed over the conductive film 112 as illustrated in FIG. 6A by light exposure using a multi-tone (high-tone) mask with which transmitted light has a plurality of intensity. The resist mask 132 has a thin film thickness in a region that overlaps with part of the gate electrode layer 101. Next, the first oxide semiconductor film 111, the second oxide semiconductor film 113, and the conductive film 112 are etched and processed into an island shape using the resist mask 132, whereby the oxide semiconductor layer 103, the buffer layer 106, a conductive layer 115, and a second terminal 124 are formed. A cross-sectional view at this stage corresponds to FIG. 6A.

Next, the resist mask 132 is subjected to ashing to form the resist mask 131. As illustrated in FIG. 6B, the resist mask 131 is reduced in area and thickness by ashing, and the region thereof having a thin thickness is removed.

Lastly, the conductive layer 115 and the second terminal 124 are etched using the resist mask 131 to form the source and drain electrode layers 105a and 105b and the second terminal 122. The resist mask 131 is reduced in area and thickness, whereby end portions of the oxide semiconductor layer 103, the buffer layer 106, the source and drain electrode layers 105a and 105b, and the second terminal 122 are also etched. Therefore, the width in a channel direction of each of the oxide semiconductor layer 103 and the buffer layer 106 is the approximately the same as that of the source and drain electrode layers. In addition, below the second terminal 122, a layer formed of the first oxide semiconductor film and the second oxide semiconductor film is formed. A cross-sectional view at this stage corresponds to FIG. 6C. Note that after a protective insulating layer 107 is formed in a later step, the gate insulating layer 102 and the protective insulating layer 107 are etched to form a contact hole, whereby a transparent conductive film is formed to connect the first terminal 121 and an FPC to each other.

Then, heat treatment is performed on the buffer layer 106 in an atmospheric atmosphere, and a high-resistance region 106c is formed. The heat treatment is performed at 200° C. to 600° C. inclusive, preferably 250° C. to 500° C. inclusive. For example, the heat treatment is performed on the substrate 100 set in a furnace in an atmospheric atmosphere at 350° C. for about one hour. When heat treatment is performed on an oxide semiconductor in an atmospheric atmosphere, the conductivity of the oxide semiconductor can be reduced. Thus, the high-resistance region 106c is formed in the exposed portion of the buffer layer 106, which does not overlap with the source and drain electrode layers 105a and 105b. Note that edge portions of the high-resistance region 106c may overlap with the source and drain electrode layers 105a and 105b. The low-resistance regions 106a and 106b which have relative low conductivity compared to the high-resistance region 106c are formed in part of the buffer layer 106, which is covered with the source and drain electrode layers 105a and 105b. Here, the conductivity of the low-resistance regions 106a and 106b is higher than that of the oxide semiconductor layer 103, and the conductivity of the high-resistance region 106c is lower than that of the low-resistance regions 106a and 106b. An atmosphere including an oxygen gas at 15 vol % to 25 vol % and a nitrogen gas at 75 vol % to 85 vol % is preferably employed for the atmospheric atmosphere.

In this manner, the buffer layer 106 including the low-resistance regions 106a and 106b and the high-resistance region 106c is formed over the oxide semiconductor layer 103, whereby the oxide semiconductor layer 103 and the source and drain electrode layers 105a and 105b can be in contact with each other with the low-resistance regions 106a and 106b interposed therebetween. Thus, contact resistance is reduced by forming an ohmic contact between the oxide semiconductor layer 103 and the source and drain electrode layers 105a and 105b, and electric characteristics of the thin film transistor can be stabilized. In addition, by provision of the high-resistance region 106c between the low-resistance regions 106a and 106b, off current which flows between the low-resistance regions 106a and 106b can be reduced.

By the heat treatment, rearrangement at the atomic level of the oxide semiconductor layer 103 is performed, and therefore the electric characteristics of the thin film transistor whose active layer is the oxide semiconductor layer 103 can be improved.

Through the above process, a thin film transistor 170 in which the oxide semiconductor layer 103 is a channel formation region, and the buffer layer 106 including the low-resistance regions 106a and 106b and the high-resistance region 106c is provided over the oxide semiconductor layer 103 can be manufactured. A cross-sectional view at this stage is illustrated in FIG. 4B. A plan view at this stage corresponds to FIG. 9.

Next, the protective insulating layer 107 is formed to cover the thin film transistor 170. For the protective insulating layer 107, a silicon nitride film, a silicon oxide film, a silicon oxynitride film, an aluminum oxide film, a tantalum oxide film, or the like which is obtained by a sputtering method or the like can be used.

Next, a photolithography process is performed and a resist mask is formed. Then, the protective insulating layer 107 is etched to form a contact hole 125 reaching the source or drain electrode layer 105b. In addition, a contact hole 126 reaching the connection electrode 120 and a contact hole 127 reaching the second terminal 122 are also formed by this etching. A cross-sectional view at this stage is illustrated in FIG. 5A.

Next, the resist mask is removed, and then a transparent conductive film is formed. The transparent conductive film is formed from indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability.

Next, a photolithography process is performed and a resist mask is formed. Then, unnecessary portions are removed by etching to form a pixel electrode layer 110.

In this photolithography process, a storage capacitor is formed with the capacitor wiring 108 and the pixel electrode layer 110, in which the gate insulating layer 102 and the protective insulating layer 107 in the capacitor portion are used as a dielectric.

In addition, in this photolithography process, the first terminal 121 and the second terminal 122 are covered with the resist mask, and transparent conductive films 128 and 129 formed in the terminal portion are left. The transparent conductive films 128 and 129 function as electrodes or wirings connected to an FPC. The transparent conductive film 128 formed over the connection electrode 120 which is directly connected to the first terminal 121 is a connection terminal electrode which functions as an input terminal of the gate wiring. The transparent conductive film 129 formed over the second terminal 122 is a connection terminal electrode which functions as an input terminal of the source wiring.

Subsequently, the resist mask is removed. A cross-sectional view at this stage is illustrated in FIG. 5B. Note a plan view at this stage corresponds to FIG. 10.

Figure 12A:
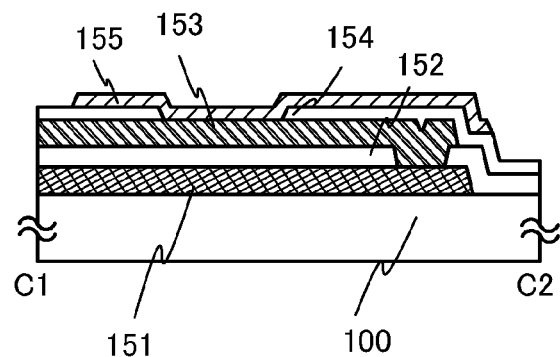
FIGS. 12A to 12D illustrate a semiconductor device according to an embodiment of the present invention.
Figure 12B:
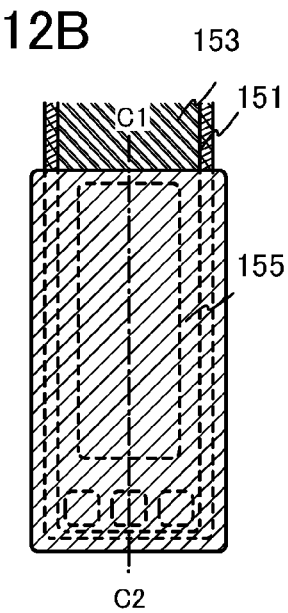

FIGS. 12A and 12B are respectively a cross-sectional view and a plan view of a gate wiring terminal portion at this stage. FIG. 12A is a cross-sectional view taken along line C1-C2 of FIG. 12B. In FIG. 12A, a transparent conductive film 155 formed over a protective insulating layer 154 is a connection terminal electrode which functions as an input terminal. Furthermore, in FIG. 12A, in the terminal portion, the first terminal 151 formed from the same material as the gate wiring and a connection electrode 153 formed from the same material as the source wiring are overlapped with each other with a gate insulating layer 152 interposed therebetween and are electrically connected. Further, the connection electrode 153 and the transparent conductive film 155 are in direct contact with each other and are electrically connected through a contact hole formed in the protective insulating layer 154.

Figure 12C:
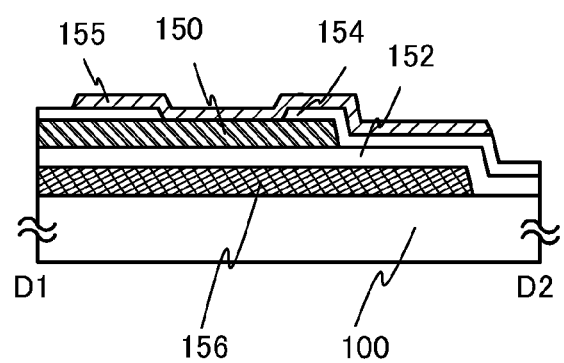
Figure 12D:
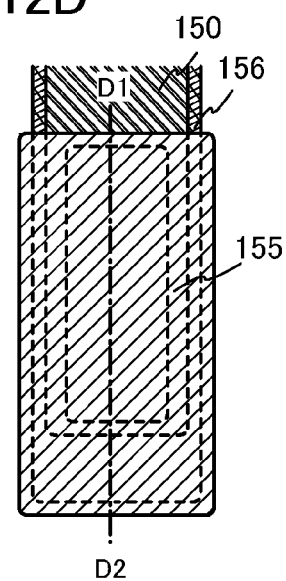

Further, FIGS. 12C and 12D are respectively a cross-sectional view and a plan view of a source wiring terminal portion. FIG. 12C is a cross-sectional view taken along line D1-D2 of FIG. 12D. In FIG. 12C, the transparent conductive film 155 formed over the protective insulating layer 154 is a connection terminal electrode which functions as an input terminal. Furthermore, in FIG. 12C, in the terminal portion, an electrode 156 formed from the same material as the gate wiring is located below and overlapped with a second terminal 150, which is electrically connected to the source wiring, with the gate insulating layer 152 interposed therebetween. The electrode 156 is not electrically connected to the second terminal 150, and a capacitor to prevent noise or static electricity can be formed when the potential of the electrode 156 is set to a potential different from that of the second terminal 150, such as floating, GND, or 0 V. The second terminal 150 is electrically connected to the transparent conductive film 155 through the protective insulating layer 154.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner as appropriate.

Thus, a pixel thin film transistor portion including the thin film transistor 170 that is a bottom-gate n-channel thin film transistor, and a storage capacitor can be completed. By arranging the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Figure 10:
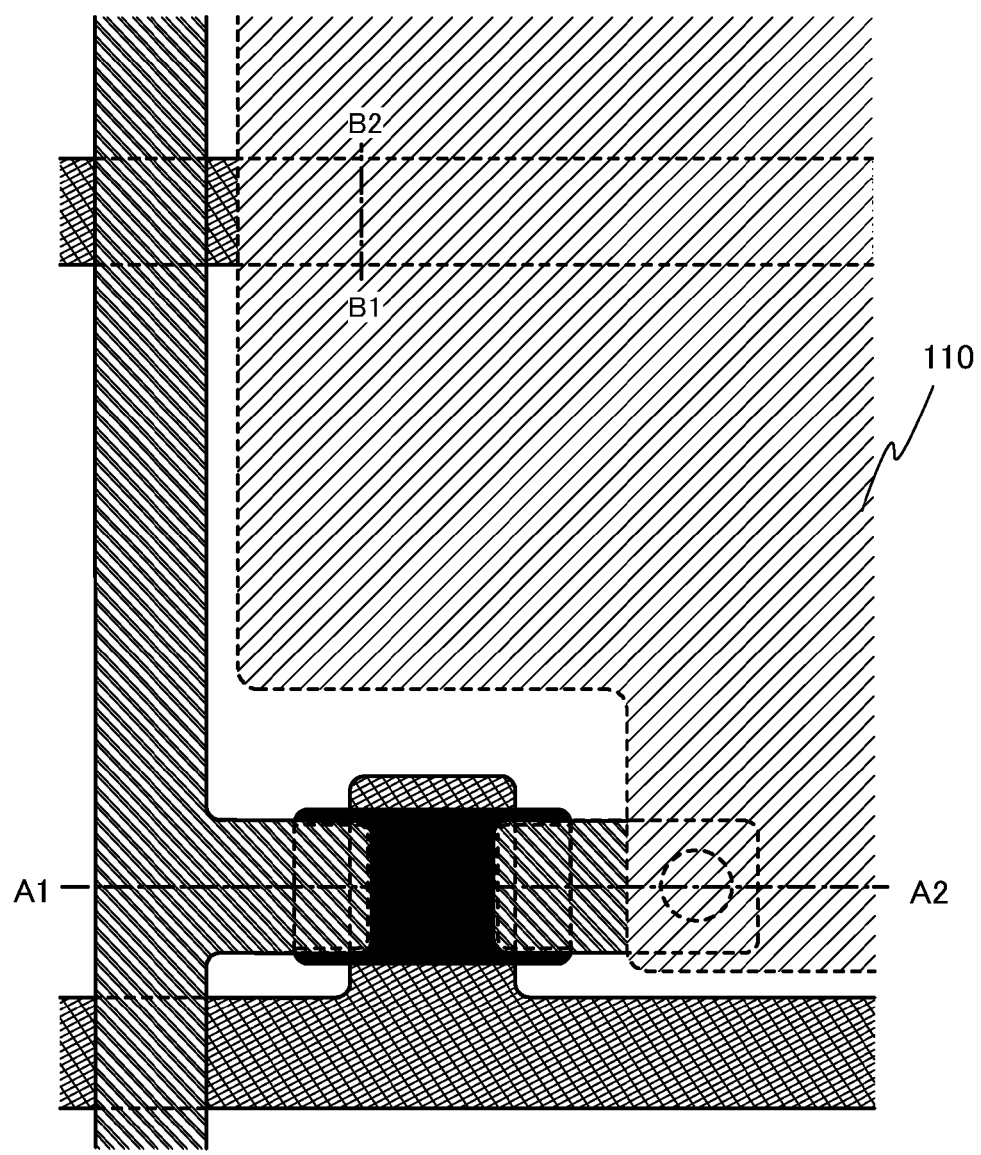
FIG. 10 illustrates the method for manufacturing a semiconductor device according to an embodiment of the present invention.
Figure 11:
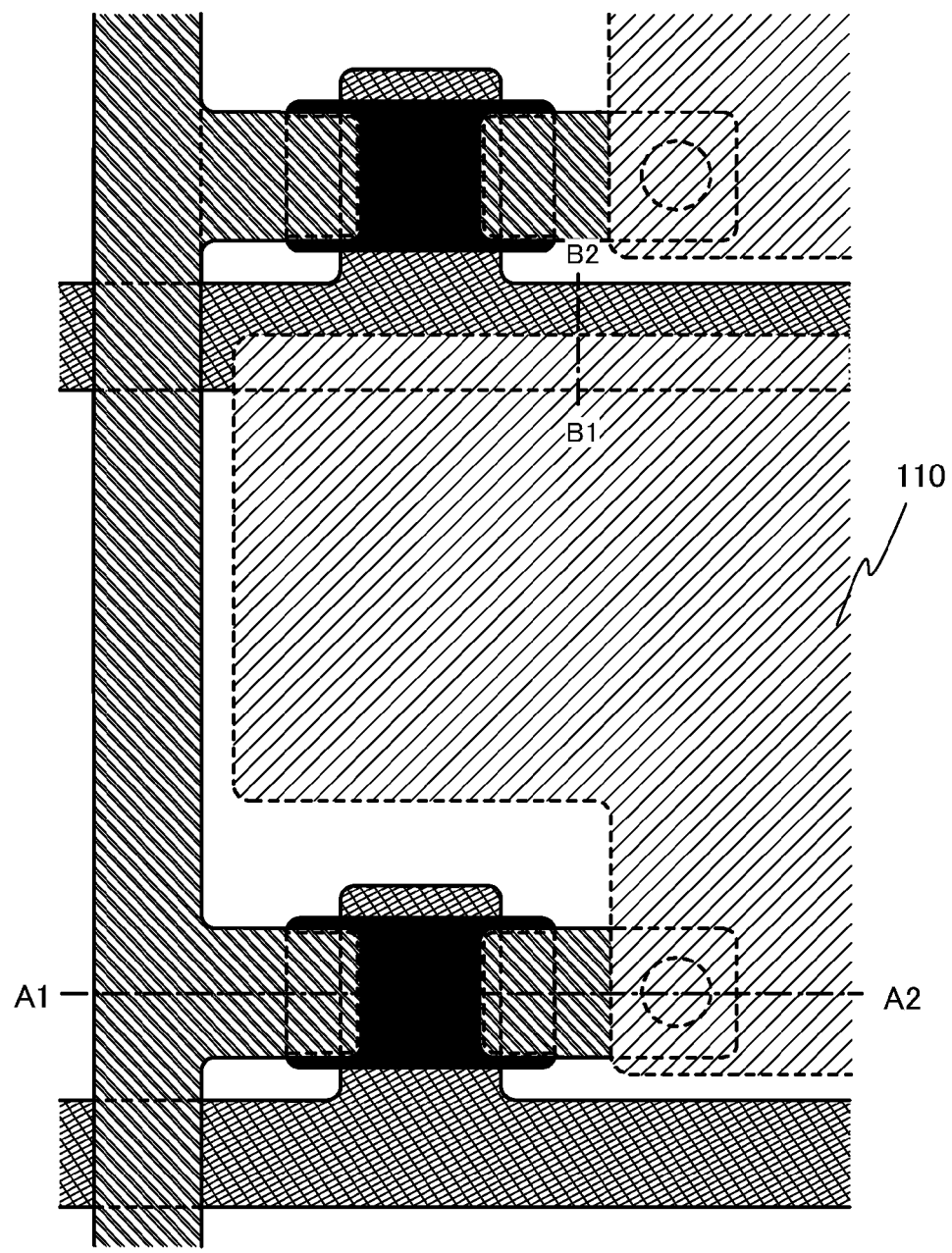
FIG. 11 illustrates a method for manufacturing a semiconductor device according to an embodiment of the present invention.

Further, this embodiment is not limited to a pixel structure of FIG. 10, and an example of a plan view different from FIG. 10 is illustrated in FIG. 11. FIG. 11 illustrates an example in which a capacitor wiring is not provided and a storage capacitor is formed with a pixel electrode layer and a gate wiring of an adjacent pixel which overlap with each other with a protective insulating layer and a gate insulating layer interposed therebetween. In this case, the capacitor wiring and the third terminal connected to the capacitor wiring can be omitted. Note that in FIG. 11, portions similar to those in FIG. 10 are denoted by the same reference numerals.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Further, there is another driving method which is so-called double-frame rate driving. In the double-frame rate driving, a vertical synchronizing frequency is set 1.5 times or more, preferably 2 times or more as high as a usual vertical synchronizing frequency, whereby moving image characteristics are improved.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor obtained in this embodiment includes an oxide semiconductor layer for a channel formation region and has excellent dynamic characteristics; thus, any of these driving methods can be combined with each other.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

As described above, in the thin film transistor using the oxide semiconductor layer, the buffer layer including the high-resistance region and the low-resistance regions is formed over the oxide semiconductor layer, and the oxide semiconductor layer and the source and drain electrode layers are in contact with each other with the low-resistance regions of the buffer layer interposed therebetween, whereby the contact resistance between the oxide semiconductor layer and the source and drain electrode layers can be reduced and the electric characteristics can be stabilized. In addition, by heating the buffer layer over the oxide semiconductor layer in the air, the buffer layer including the high-resistance region and the low-resistance regions can be formed.

By using the thin film transistor for a pixel portion and a driver circuit portion of a display device, the display device can have stable electric characteristics and high reliability.

Note that the structure described in this embodiment can be combined with any of the structures described in other embodiments as appropriate.

[Embodiment 3]

In this embodiment, an inverter circuit using two bottom-gate thin film transistors described in Embodiment 1 will be described with reference to FIGS. 14A to 14C.

A driver circuit for driving a pixel portion is formed using an inverter circuit, a capacitor, a resistor, and the like. When the inverter circuit is formed using two n-channel TFTs in combination, there are an inverter circuit having a combination of an enhancement type transistor and a depletion type transistor (hereinafter, referred to as an EDMOS circuit) and an inverter circuit having a combination of two enhancement type TFTs (hereinafter, referred to as an EEMOS circuit). Note that an n-channel TFT whose threshold voltage is positive is referred to as an enhancement type transistor, and an n-channel TFT whose threshold voltage is negative is referred to as a depletion type transistor, throughout this specification.

The pixel portion and the driver circuit are formed over one substrate. In the pixel portion, on and off of voltage application to a pixel electrode are switched by enhancement type transistors arranged in matrix. The enhancement type transistors arranged in the pixel portion include an oxide semiconductor.

Figure 14A:
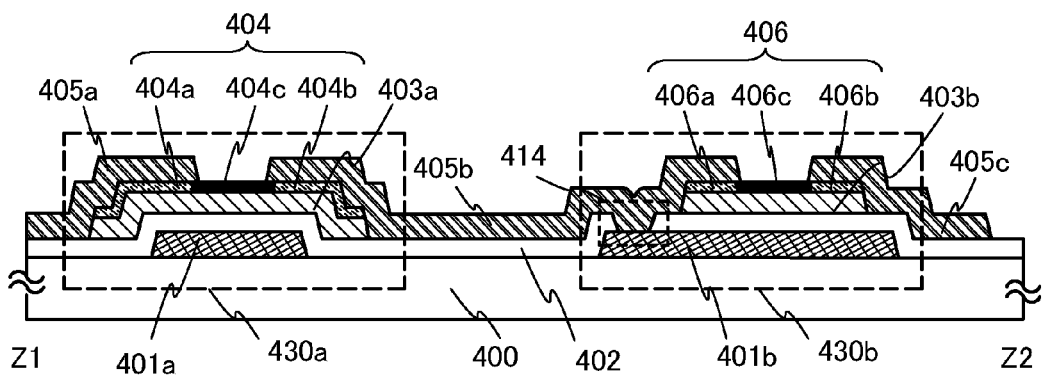
FIGS. 14A to 14C illustrate a semiconductor device according to an embodiment of the present invention.

A cross-sectional structure of the inverter circuit of the driver circuit is illustrated in FIG. 14A. Note that in FIG. 14A, the inverted staggered thin film transistor illustrated in FIGS. 1A and 1B is used as a first thin film transistor 430a and a second thin film transistor 430b. However, a thin film transistor that can be used for the inverter circuit described in this embodiment is not limited to this structure.

In the first thin film transistor 430a illustrated in FIG. 14A, a first gate electrode layer 401a is provided over a substrate 400, a gate insulating layer 402 is provided over the first gate electrode layer 401a, a first oxide semiconductor layer 403a is provided over the gate insulating layer 402, a first buffer layer 404 is provided over the first oxide semiconductor layer 403a, and a first wiring 405a and a second wiring 405b are provided over the first buffer layer 404. The first buffer layer 404 includes low-resistance regions 404a and 404b and a high-resistance region 404c, and the first oxide semiconductor layer 403a is electrically connected to the first wiring 405a and the second wiring 405b with the low-resistance regions 404a and 404b interposed therebetween. Similarly, in the second thin film transistor 430b, a second gate electrode layer 401b is provided over the substrate 400, the gate insulating layer 402 is provided over the second gate electrode layer 401b, a second oxide semiconductor layer 403b is provided over the gate insulating layer 402, a second buffer layer 406 is provided over the second oxide semiconductor layer 403b, and the second wiring 405b and a third wiring 405c are provided over the second buffer layers 406. The second buffer layer 406 includes low-resistance regions 406a and 406b and a high-resistance region 406c, and the second oxide semiconductor layer 403b is electrically connected to the second wiring 405b and the third wiring 405c with the low-resistance regions 406a and 406b interposed therebetween. Here, the second wiring 405b is directly connected to the second gate electrode layer 401b through a contact hole 414 formed in the gate insulating layer 402. Note that as for the structures and materials of the respective portions, the thin film transistor described in Embodiment 1 is to be referred to.

The first wiring 405a is a power supply line at a ground potential (a ground power supply line). This power supply line at a ground potential may be a power supply line to which a negative voltage VDL is applied (a negative power supply line). The third wiring 405c is a power supply line to which a positive voltage $V_{DD}$ is applied (a positive power supply line).

As illustrated in FIG. 14A, the second wiring 405b which is electrically connected to both the first buffer layer 404 and the second buffer layer 406 is directly connected to the second gate electrode layer 401b of the second thin film transistor 430b through the contact hole 414 formed in the gate insulating layer 402. By the direct connection, favorable contact can be obtained, which leads to a reduction in contact resistance. In addition, since the second wiring 405b and the second gate electrode layer 401b can be directly connected to each other before heat treatment in an atmospheric atmosphere for forming the high-resistance regions 404c and 406c, favorable contact can be obtained without influence of the heat treatment in an atmospheric atmosphere. Further, in comparison with the case where the second gate electrode layer 401b and the second wiring 405b are connected to each other through another conductive film, for example, a transparent conductive film, reduction in the number of contact holes and reduction in an area occupied by the driver circuit due to the reduction in the number of contact holes can be achieved.

Figure 14B:
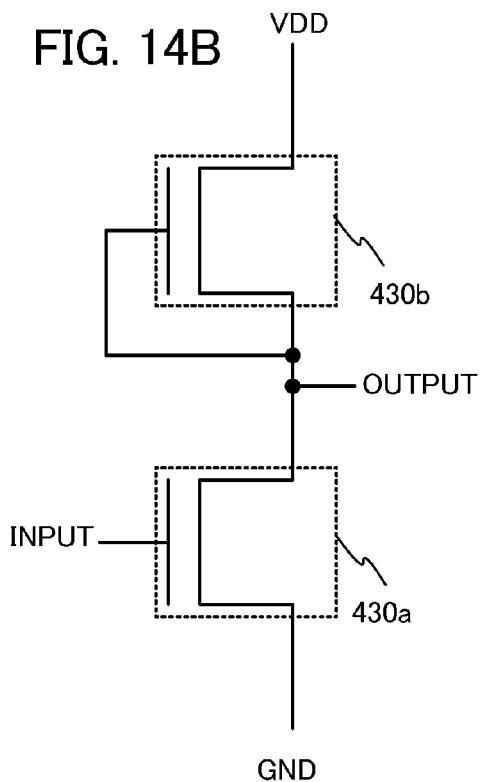
Figure 14C:
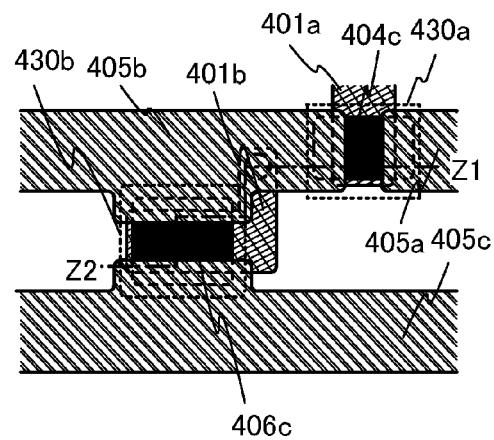

Further, FIG. 14C is a plan view of the inverter circuit of the driver circuit. In FIG. 14C, a cross section taken along the chain line Z1-Z2 corresponds to FIG. 14A.

Further, an equivalent circuit of the EDMOS circuit is illustrated in FIG. 14B. The circuit connection illustrated in FIGS. 14A and 14C corresponds to that illustrated in FIG. 14B. An example in which the first thin film transistor 430a is an enhancement type n-channel transistor and the second thin film transistor 430b is a depletion type n-channel transistor is illustrated.

In order to manufacture an enhancement type n-channel transistor and a depletion type n-channel transistor over one substrate, for example, the first buffer layer 404 and the first oxide semiconductor layer 403a are formed using different materials or under different conditions from those of the second buffer layer 406 and the second oxide semiconductor layer 403b. Alternatively, an EDMOS circuit may be formed in such a manner that gate electrodes are provided over and under the oxide semiconductor layer to control the threshold value and a voltage is applied to the gate electrodes so that one of the TFTs is normally on while the other TFT is normally off.

Alternatively, without being limited to the EDMOS circuit, an EEMOS circuit can be manufactured in such a manner that the first thin film transistor 430a and the second thin film transistor 430b are enhancement type n-channel transistors. In that case, the third wiring 405c and the second gate electrode layer 401b are connected to each other instead of the connection between the second wiring 405b and the second gate electrode layer 401b.

In each of the thin film transistors used in this embodiment, the buffer layer including the high-resistance region and the low-resistance regions is formed over the oxide semiconductor layer, and the oxide semiconductor layer is in contact with the source and drain electrode layers with the low-resistance regions of the buffer layer interposed therebetween; thus, contact resistance between the oxide semiconductor layer and the source and drain electrode layers can be reduced and the electric characteristics can be stabilized. Accordingly, circuit characteristics of the inverter circuit described in this embodiment can be improved.

With the use of the inverter circuit described in this embodiment for a driver circuit portion, a display device having stable electric characteristics and high reliability can be provided.

Note that the structure described in this embodiment can be combined with any of the structures described in other embodiments as appropriate.

[Embodiment 4]

In this embodiment, an example will be described below, in which at least part of a driver circuit and a thin film transistor arranged in a pixel portion are formed over one substrate in a display device which is one example of a semiconductor device.

The thin film transistor to be arranged in the pixel portion is formed according to Embodiment 2. Further, the thin film transistor described in any of Embodiments 1 to 3 is an n-channel TFT, and thus part of a driver circuit that can include an n-channel TFT among driver circuits is formed over the same substrate as the thin film transistor of the pixel portion.

Figure 15A:
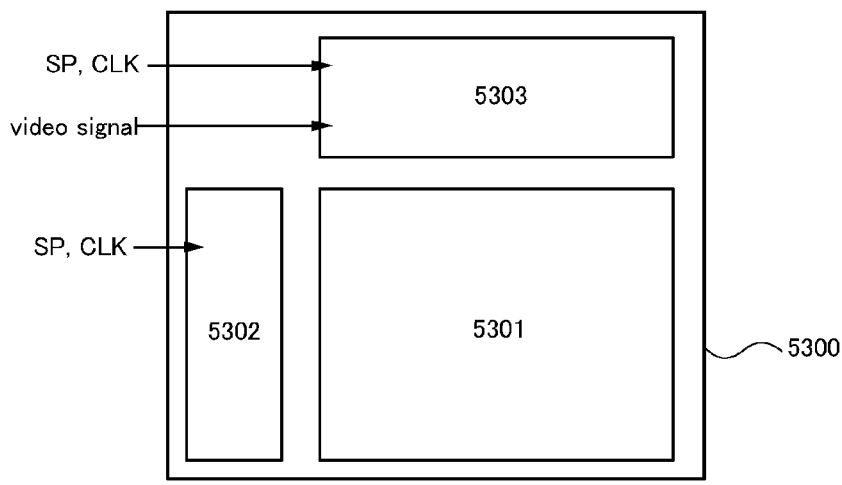
FIGS. 15A and 15B each illustrate a block diagram of a semiconductor device.

FIG. 15A illustrates an example of a block diagram of an active matrix liquid crystal display device, which is an example of a semiconductor device. The display device illustrated in FIG. 15A includes, over a substrate 5300, a pixel portion 5301 having a plurality of pixels each provided with a display element, a scan-line driver circuit 5302 that selects each pixel, and a signal line driver circuit 5303 that controls a video signal input to a selected pixel.

The pixel portion 5301 is connected to the signal line driver circuit 5303 by a plurality of signal lines S1 to Sm (not shown) which extend in a column direction from the signal line driver circuit 5303, and to the scan line driver circuit 5302 by a plurality of scan lines G1 to Gn (not shown) that extend in a row direction from the scan line driver circuit 5302. The pixel portion 5301 includes a plurality of pixels (not illustrated) arranged in a matrix form by the signal lines S1 to Sm and the scan lines G1 to Gn. Then, each pixel is connected to a signal line Sj (any one of the signal lines S1 to Sm) and a scan line Gi (any one of the scan lines G1 to Gn).

In addition, the thin film transistor described in any of Embodiments 1 to 3 is an n-channel TFT, and a signal line driver circuit including the n-channel TFT is described with reference to FIG. 16.

Figure 16:
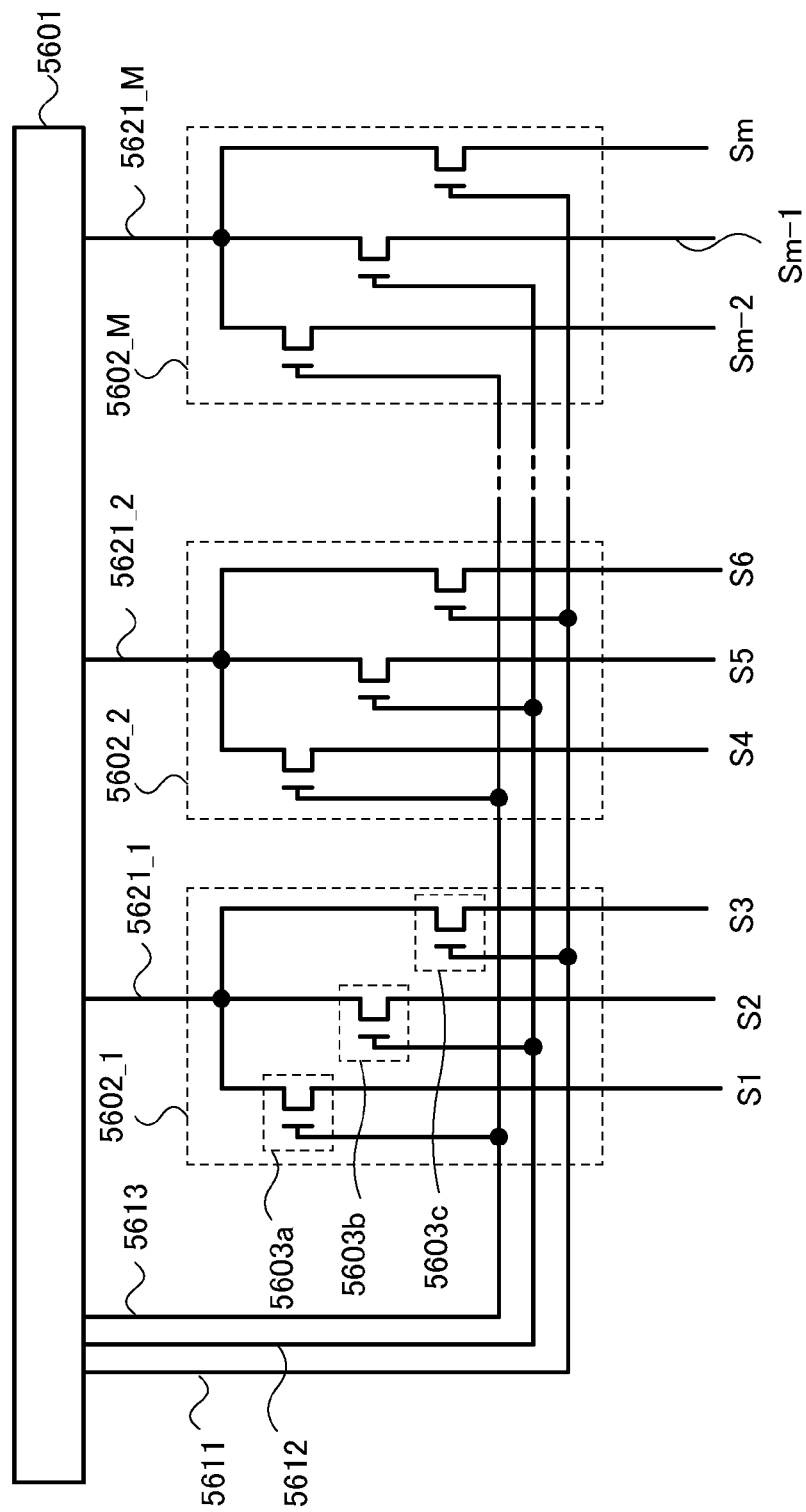
FIG. 16 illustrates a structure of a signal line driver circuit.

The signal-line driver circuit illustrated in FIG. 16 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines (a signal line Sm−2, a signal line Sm−1, and a signal line Sm (m=3M)) via the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−2, a signal line Sj−1, and a signal line Sj (j=3J) via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed using a single crystal semiconductor. Further, the switch groups 5602_1 to 5602_M are preferably formed over the same substrate as the pixel portion is. Therefore, the driver IC 5601 and the switch groups 5602_1 to 5602_M are preferably connected through an FPC or the like. Alternatively, the driver IC 5601 may be formed using a single crystal semiconductor layer which is provided by a method such as bonding over the same substrate as the pixel portion is.

Figure 17:
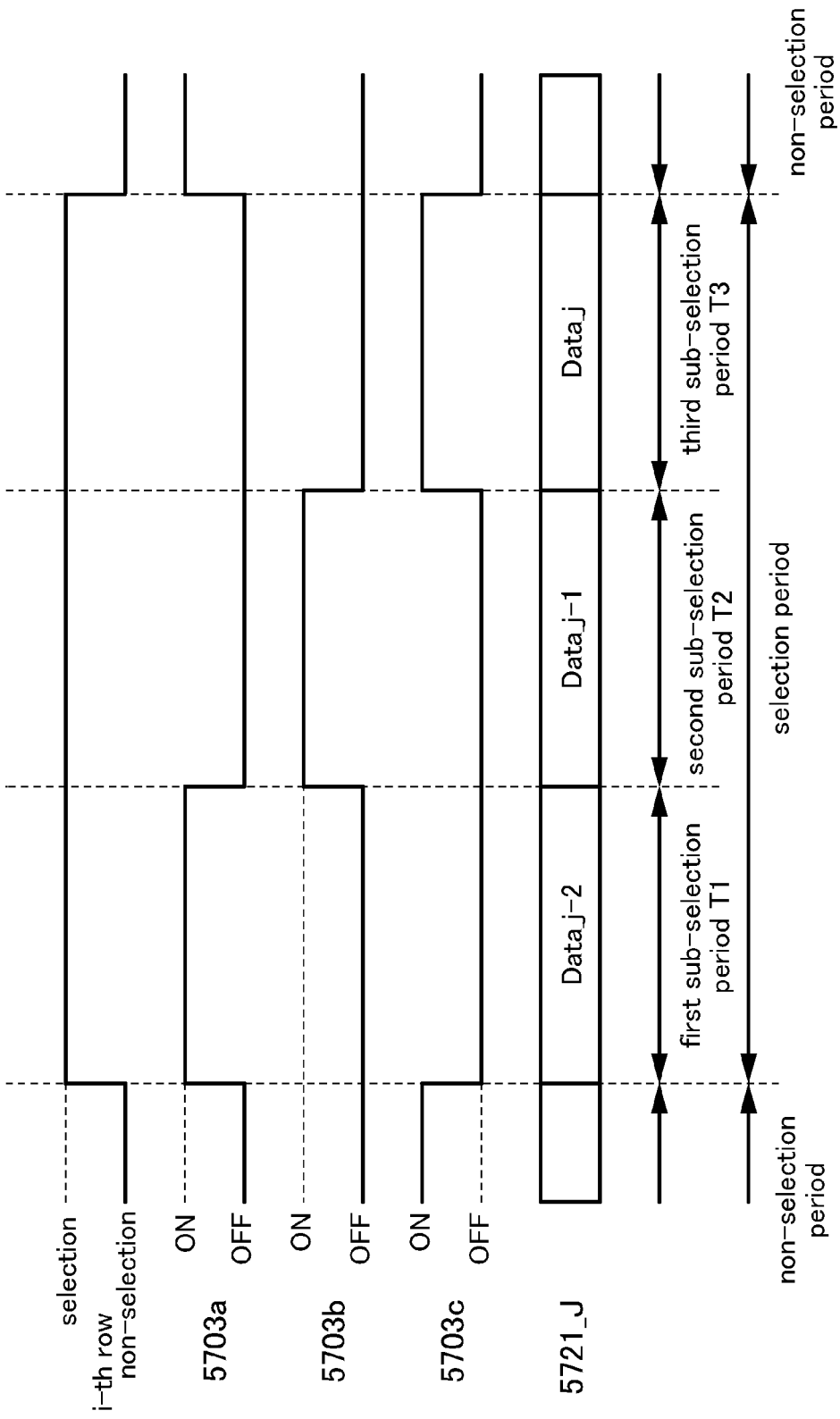
FIG. 17 is a timing chart showing operation of a signal line driver circuit.

Next, operation of the signal-line driver circuit illustrated in FIG. 16 is described with reference to a timing chart of FIG. 17. FIG. 17 illustrates the timing chart where the scan line Gi in the i-th row is selected. A selection period of the scan line Gi of the i-th row is divided into a first sub-selection period T1, a second sub-selection period T2, and a third sub-selection period T3. Furthermore, the signal-line driver circuit in FIG. 16 operates similarly to that in FIG. 17 even when a scan line of another row is selected.

Note that the timing chart of FIG. 17 illustrates the case where the wiring 5621_J in the J-th column is connected to the signal line Sj−2, the signal line Sj−1, and the signal line Sj through the first thin film transistor 5603a, the second thin film transistor 5603b, and the third thin film transistor 5603c.

The timing chart of FIG. 17 illustrates timing when the scan line Gi in the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−2, a video signal input to the wiring 5621_J in the second sub-selection period T2 is input to the signal line Sj−1, and a video signal input to the wiring 5621_J in the third sub-selection period T3 is input to the signal line Sj. In addition, the video signals input to the wiring 5621_J in the first sub-selection period T1, the second sub-selection period T2, and the third sub-selection period T3 are denoted by Data_j−2, Data_j−1, and Data_j.

As illustrated in FIG. 17, in the first sub-selection period T1, the first thin film transistor 5603a is turned on, and the second thin film transistor 5603b and the third thin film transistor 5603c are turned off. At this time, Data_j−2 input to the wiring 5621_J is input to the signal line Sj−2 via the first thin film transistor 5603a. In the second sub-selection period T2, the second thin film transistor 5603b is turned on, and the first thin film transistor 5603a and the third thin film transistor 5603c are turned off. At this time, Data_j−1 input to the wiring 5621_J is input to the signal line Sj−1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal-line driver circuit of FIG. 16, one gate selection period is divided into three; thus, video signals can be input to three signal lines through one wiring 5621 in one gate selection period. Therefore, in the signal-line driver circuit of FIG. 16, the number of connections between the substrate provided with the driver IC 5601 and the substrate provided with the pixel portion can be reduced to approximately one third of the number of signal lines. The number of connections is reduced to approximately one third of the number of signal lines, so that the reliability, yield, and the like of the signal-line driver circuit of FIG. 16 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 17.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 18:
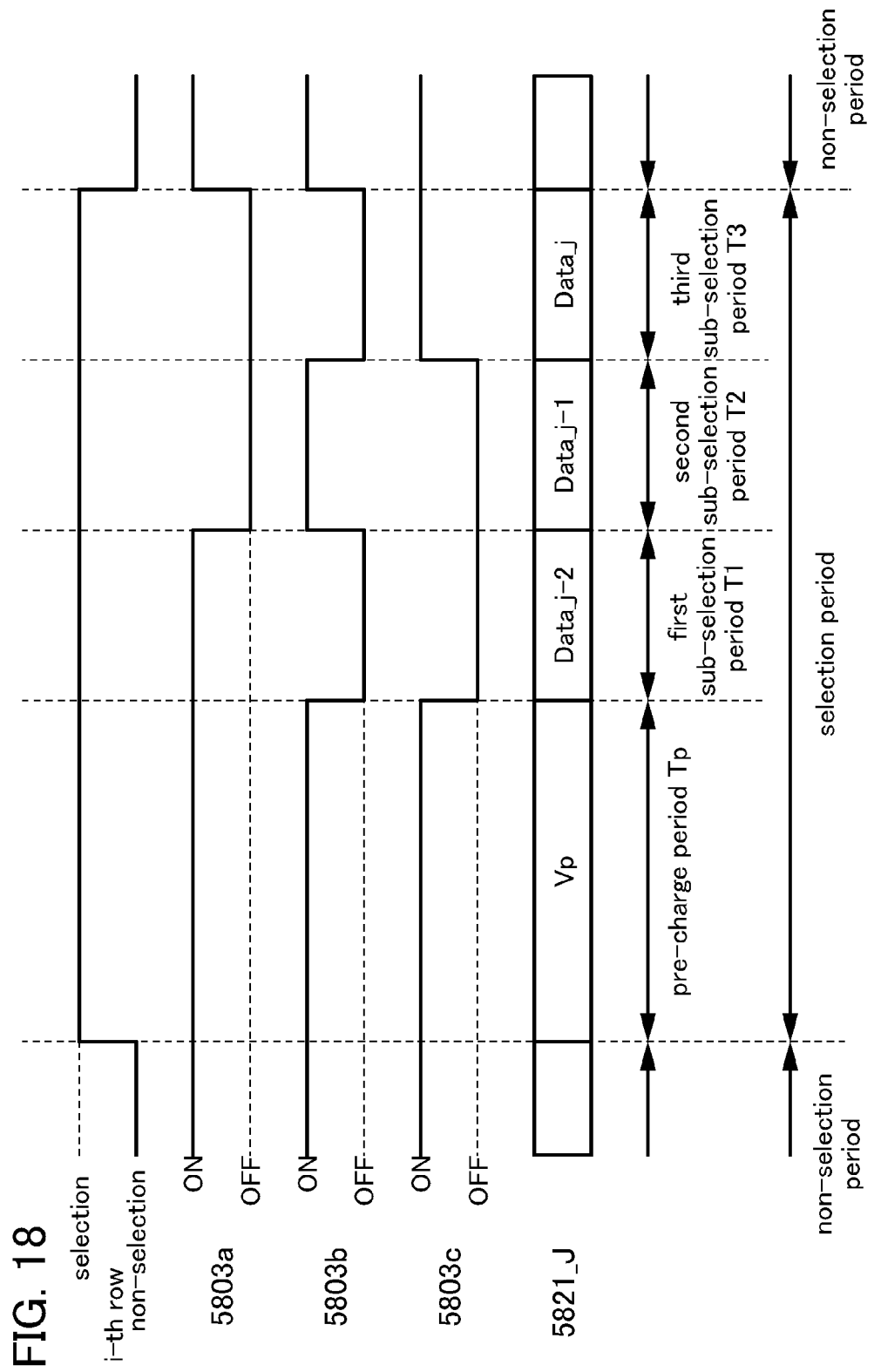
FIG. 18 is a timing chart showing operation of a signal line driver circuit.

As another example, as illustrated in a timing chart of FIG. 18, one selection period may be divided into a pre-charge period Tp, the first sub-selection period T1, the second sub-selection period T2, and the third sub-selection period T3. Further, the timing chart of FIG. 18 illustrates timing when the scan line Gi in the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J in the J-th column. As illustrated in FIG. 18, the first thin film transistor 5603a, the second thin film transistor 5603b, and the third thin film transistor 5603c are turned on in the pre-charge period Tp. At this time, precharge voltage Vp input to the wiring 5621_J is input to each of the signal line Sj−2, the signal line Sj−1, and the signal line Sj via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−2 input to the wiring 5621_J is input to the signal line Sj−2 via the first thin film transistor 5603a. In the second sub-selection period T2, the second thin film transistor 5603b is turned on, and the first thin film transistor 5603a and the third thin film transistor 5603c are turned off.

At this time, Data_j−1 input to the wiring 5621_J is input to the signal line Sj−1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal-line driver circuit of FIG. 16, to which the timing chart of FIG. 18 is applied, a signal line can be pre-charged by providing a pre-charge selection period before sub-selection periods. Thus, a video signal can be written to a pixel at a high speed. Note that portions in FIG. 18 similar to those in FIG. 17 are denoted by the same reference numerals, and detailed description of the same portions and portions having similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of the shift register used for part of the scan-line driver circuit is described with reference to FIG. 19 and FIG. 20.

Figure 19:
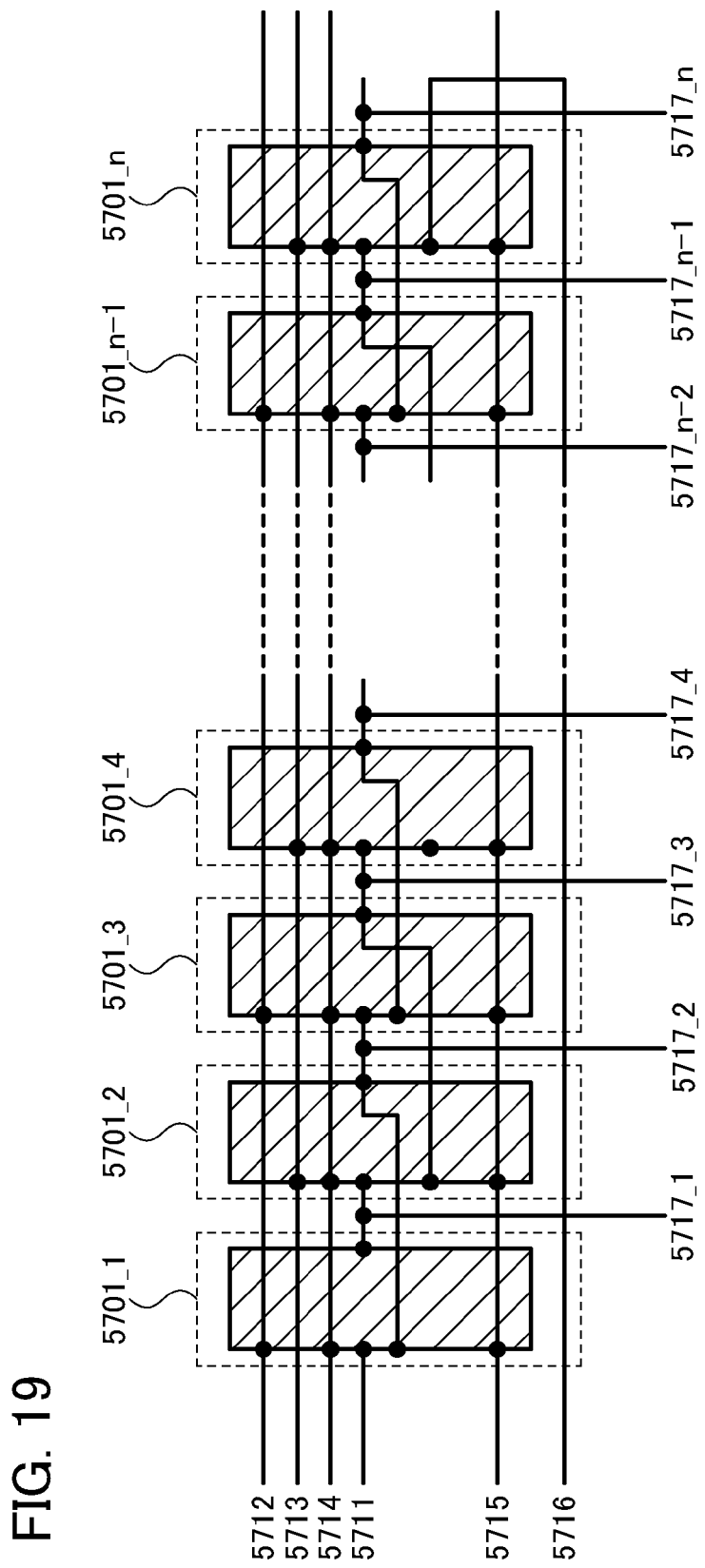
FIG. 19 illustrates a structure of a shift register.

FIG. 19 illustrates a circuit configuration of the shift register. The shift register illustrated in FIG. 19 includes a plurality of flip-flops, flip-flops 5701_1 to 5701_n. The shift register is operated with input of a first clock signal, a second clock signal, a start pulse signal, and a reset signal.

Connection relations of the shift register in FIG. 19 are described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5717_2 of a second stage is connected to a third wiring 5713, the fourth wiring 5714, the fifth wiring 5715, the seventh wiring 5717_1, the seventh wiring 57172, and a seventh wiring 5717_3.

In a similar manner, the flip-flop 5701_i (any one of the flip-flops 5701_1 to 5701_n) of an i-th stage is connected to one of the second wiring 5712 and the third wiring 5713, the fourth wiring 5714, the fifth wiring 5715, a seventh wiring 5717_i−1, a seventh wiring 5717_i, and a seventh wiring 5717_i+1. Here, when the "i" is an odd number, the flip-flop 5701_i of the i-th stage is connected to the second wiring 5712; when the "i" is an even number, the flip-flop 5701_i of the i-th stage is connected to the third wiring 5713.

The flip-flop 5701_n of an n-th stage is connected to one of the second wiring 5712 and the third wiring 5713, the fourth wiring 5714, the fifth wiring 5715, a seventh wiring 5717n-1, the seventh wiring 5717_n, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Figure 20:
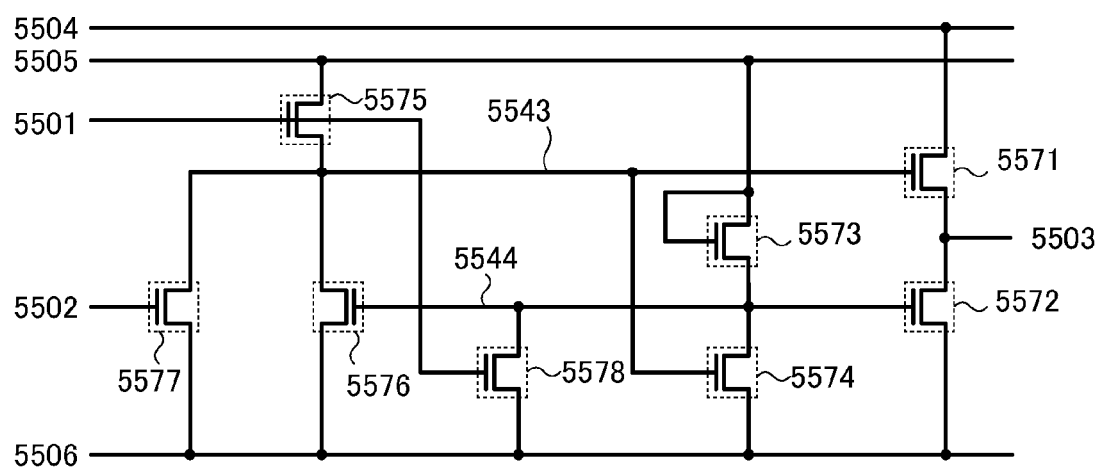
FIG. 20 illustrates a connection structure of a flip-flop of FIG. 19.

Next, FIG. 20 illustrates details of the flip-flop in FIG. 19. A flip-flop illustrated in FIG. 20 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

In addition, the flip-flop illustrated in FIG. 20 includes a first wiring 5501, a second wiring 5502, a third wiring 5503, a fourth wiring 5504, a fifth wiring 5505, and a sixth wiring 5506.

Note that all thin film transistors here are enhancement-mode n-channel transistors; however, the present invention is not limited thereto. For example, the driver circuit can be operated using depression-mode n-channel transistors.

Next, connection structures of the flip-flop shown in FIG. 20 are described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505, and a second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502.

A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the flip-flop 5701_*i* of the i-th stage, the first wiring 5501 in FIG. 20 is connected to the seventh wiring 5717_*i*−1 in FIG. 19. The second wiring 5502 in FIG. 20 is connected to the seventh wiring 5717_*i*+1 in FIG. 19. The third wiring 5503 in FIG. 20 is connected to the seventh wiring 5717_*i*. The sixth wiring 5506 in FIG. 20 is connected to the fifth wiring 5715.

If the "i" is an odd number, the fourth wiring 5504 in FIG. 20 is connected to the second wiring 5712 in FIG. 19; if the "i" is an even number, the fourth wiring 5504 in FIG. 20 is connected to the third wiring 5713 in FIG. 19. In addition, the fifth wiring 5505 in FIG. 20 is connected to the fourth wiring 5714 in FIG. 19.

Note that in the flip-flop 5701_1 of the first stage, the first wiring 5501 in FIG. 20 is connected to the first wiring 5711 in FIG. 19. In addition, in the flip-flop 5701_*n* of the n-th stage, the second wiring 5502 in FIG. 20 is connected to the sixth wiring 5716 in FIG. 19.

In addition, the signal line driver circuit and the scan line driver circuit can be formed using only the n-channel TFTs described in any of Embodiments 1 to 3. The n-channel TFT described in any of Embodiments 1 to 3 has a high mobility, and thus a driving frequency of a driver circuit can be increased. Further, in the case of the n-channel TFT described in any of Embodiments 1 to 3, since parasitic capacitance is reduced by using an oxide semiconductor layer typified by an In—Ga—Zn—O-based non-single-crystal film, frequency characteristics (also referred to as f characteristics) is favorable. For example, the scan-line driver circuit including the n-channel TFT described in Embodiments 1 to 3 can operate at high speed; therefore, it is possible to increase the frame frequency or to achieve insertion of a black screen, for example.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 15B:
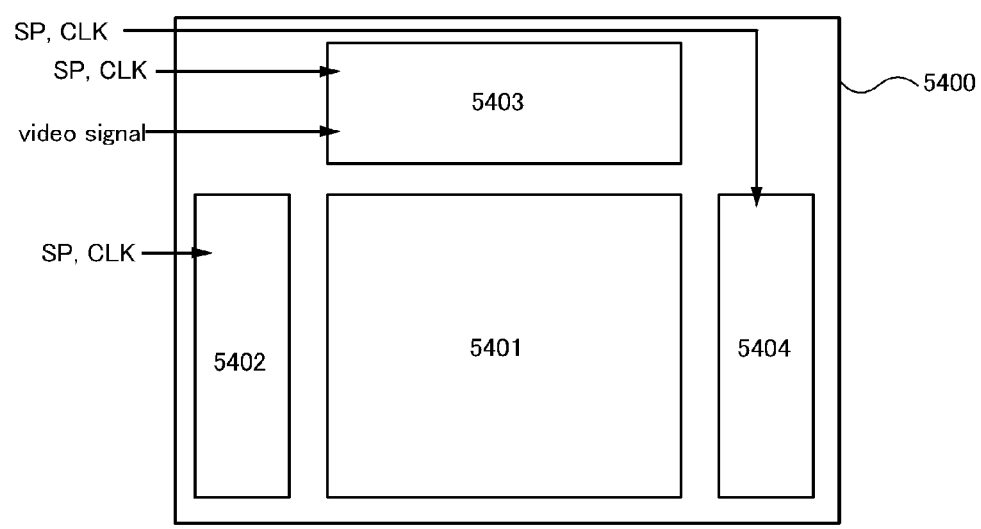

Further, when an active matrix light-emitting display device which is an example of a semiconductor device is manufactured, a plurality of thin film transistors are arranged in at least one pixel, and thus a plurality of scan line driver circuits are preferably arranged. FIG. 15B illustrates an example of a block diagram of an active matrix light-emitting display device.

The light-emitting display device illustrated in FIG. 15B includes, over a substrate 5400, a pixel portion 5401 including a plurality of pixels each provided with a display element, a first scan-line driver circuit 5402 and a second scan-line driver circuit 5404 that selects a pixel, and a signal-line driver circuit 5403 that controls a video signal input to the selected pixel.

In the case where the video signal input to a pixel of the light-emitting display device illustrated in FIG. 15B is a digital signal, the pixel is put in a light-emitting state or a non-light-emitting state by switching on/off of a transistor. Thus, grayscale can be displayed using an area grayscale method or a time grayscale method. An area grayscale method refers to a driving method in which one pixel is divided into a plurality of subpixels and the respective subpixels are driven independently based on video signals so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of subframe periods. Then, in accordance with video signals, the light-emitting element in the pixel is brought into a light-emitting state or a non-light-emitting state in each subframe period. By dividing one frame period into a plurality of subframe periods, the total length of time, in which a pixel actually emits light in one frame period, can be controlled by video signals so that grayscale can be displayed.

Note that in the example of the light-emitting display device illustrated in FIG. 15B, when two switching TFTs are arranged in one pixel, the first scan-line driver circuit 5402 generates a signal which is input to a first scan line serving as a gate wiring of one of the two switching TFTs, and the second scan-line driver circuit 5404 generates a signal which is input to a second scan line serving as a gate wiring of the other of the two switching TFTs. However, one scan-line driver circuit may generate both the signal which is input to the first scan line and the signal which is input to the second scan line. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

Also in the light-emitting display device, a part of a driver circuit that can include n-channel TFTs among driver circuits can be formed over the same substrate as the thin film transistors of the pixel portion. In addition, the signal line driver circuit and the scan line driver circuit can be formed using only the n-channel TFTs described in any of Embodiments 1 to 3.

Through the above process, a display device having stable electric characteristics and high reliability as a semiconductor device can be manufactured.

Note that the structure described in this embodiment can be combined with any of the structures described in other embodiments as appropriate.

[Embodiment 5]

The thin film transistor described in any of Embodiments 1 to 3 can be manufactured, and the thin film transistor can be used for a pixel portion and further for a driver circuit, so that a semiconductor device having a display function (also referred to as a display device) can be manufactured. Further, part or whole of a driver circuit can be formed over the same substrate as a pixel portion, using the thin film transistor described in any of Embodiments 1 to 3, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device also relates to an element substrate, which corresponds to an embodiment before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Figure 21A:
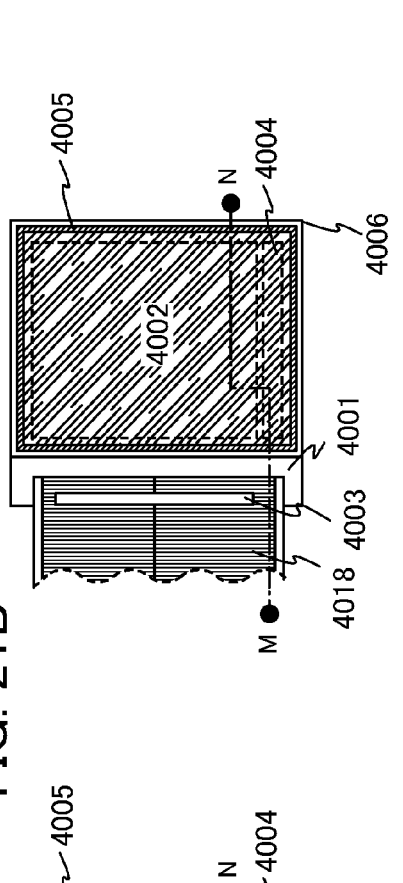
FIGS. 21A to 21C illustrate a semiconductor device according to an embodiment of the present invention.
Figure 21B:
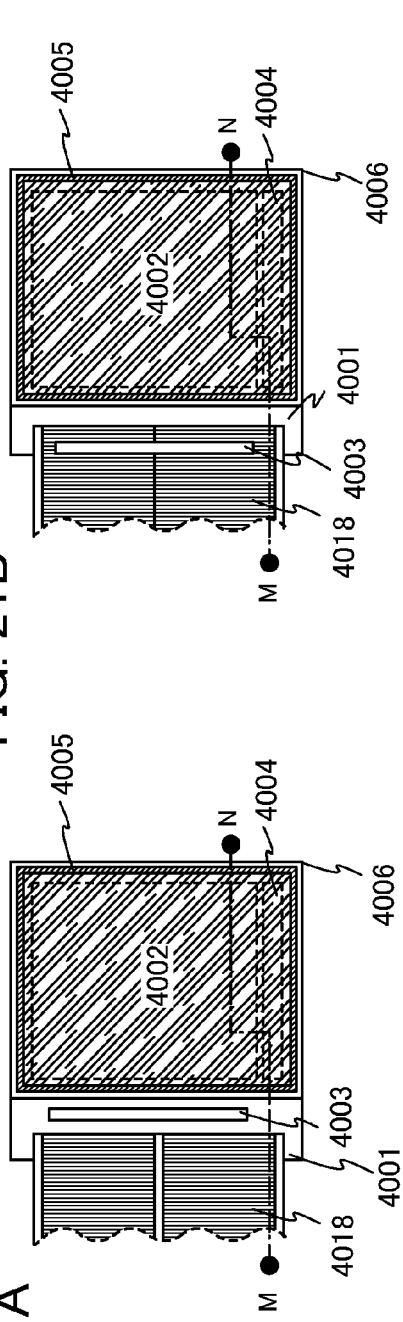
Figure 21C:
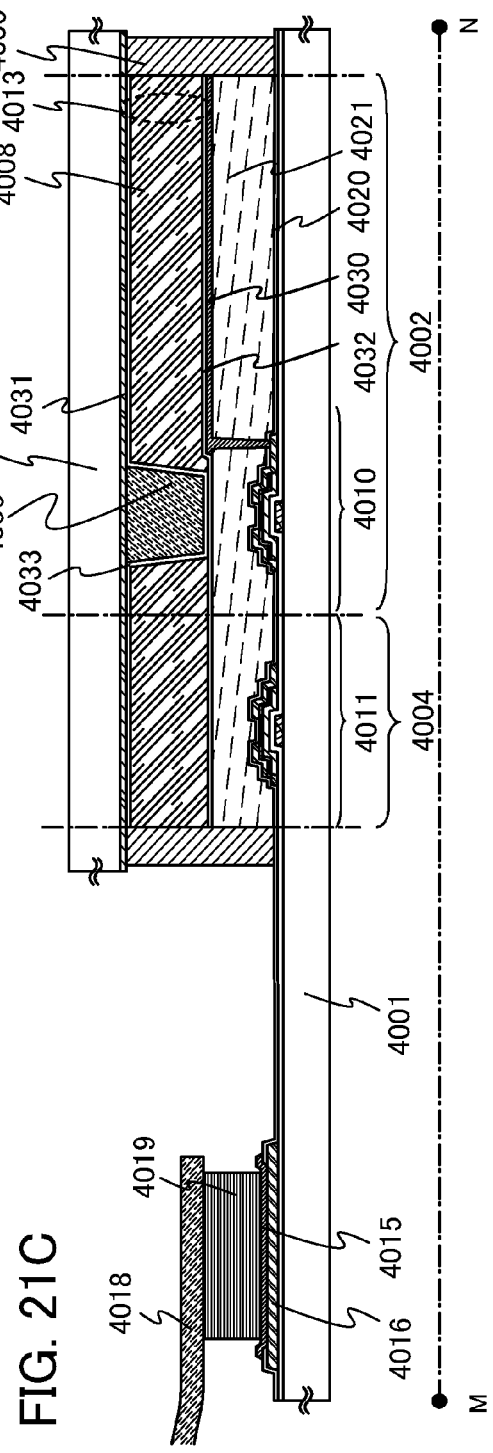

The appearance and cross section of a liquid crystal display panel which is one mode of a semiconductor device will be described in this embodiment with reference to FIGS. 21A and 21B and FIG. 21C. FIGS. 21A and 21B are each a plan view of a panel in which thin film transistors 4010 and 4011 and a liquid crystal element 4013, which are formed over a first substrate 4001, are sealed between the first substrate 4001 and a second substrate 4006 with a sealant 4005. The thin film transistors 4010 and 4011 are thin film transistors having stable electric characteristics and high reliability, which are described any of Embodiment 1 to Embodiment 3 and include the oxide semiconductor layer typified by an In—Ga—Zn—O-based non-single-crystal film. FIG. 21C is a cross-sectional view taken along line M-N of FIGS. 21A and 21B.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 21A illustrates an example of mounting the signal line driver circuit 4003 by a COG method, and FIG. 21B illustrates an example of mounting the signal line driver circuit 4003 by a TAB method.

The pixel portion 4002 and the scan line driver circuit 4004 provided over the first substrate 4001 include a plurality of thin film transistors. FIG. 21B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

As the thin film transistors 4010 and 4011, thin film transistors having stable electric characteristics and high reliability which are described in any of Embodiments 1 to 3 and include the oxide semiconductor layer typified by an In—Ga—Zn—O-based non-single-crystal film, can be used. In Embodiment 7, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

Although the example of a transmissive liquid crystal display device is described in this embodiment, one embodiment of the present invention can also be applied to a reflective liquid crystal display device and a transflective liquid crystal display device.

While an example of the liquid crystal display device in which the polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce the unevenness of the surface of the thin film transistors and to improve the reliability of the thin film transistors, the thin film transistors which are obtained in any of Embodiments 1 to 3 are covered with protective films or insulating layers (the insulating layers 4020 and 4021) which function as planarizing insulating films. Note that the protective film is provided to prevent entry of contaminant impurities such as organic substance, metal, or moisture existing in air and is preferably a dense film. The protective film may be formed with a single layer or a stacked layer of any of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method. Although an example in which the protective film is formed by a sputtering method is described in this embodiment, the present invention is not limited to this method and a variety of methods may be employed.

The insulating layer 4020 having a layered structure can be formed as the protective film. Here, a silicon oxide film is formed by a sputtering method, as a first layer of the insulating layer 4020. The use of a silicon oxide film as a protective film has an effect of preventing hillock of an aluminum film which is used as the source and drain electrode layers.

Further, as a second layer of the protective film, an insulating layer is formed. Here, a silicon nitride film is formed by a sputtering method, as a second layer of the insulating layer 4020. The use of the silicon nitride film as the protective film can prevent mobile ions of sodium or the like from entering a semiconductor region so that variation in electrical characteristics of the TFT can be suppressed.

Further, after the protective film is formed, the oxide semiconductor layer may be annealed (at 300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (for example, an alkyl group or an aryl group) or a fluoro group. In addition, the organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (an ink-jet method, screen printing, offset printing, or the like), a doctor knife, a roll coater, a curtain coater, a knife coater, or the like. In the case of forming the insulating layer 4021 with the use of a material solution, annealing (300° C. to 400° C.) may be performed on the oxide semiconductor layer at the same time as a baking step. When the baking of the insulating layer 4021 and the annealing of the oxide semiconductor layer are performed at the same time, a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 via an anisotropic conductive film 4019.

Note that FIGS. 21A to 21C illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 22:
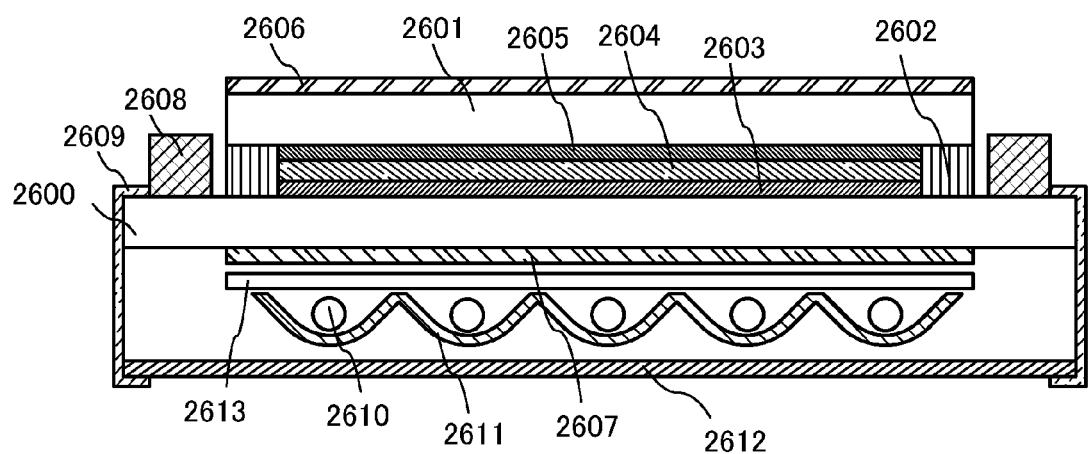
FIG. 22 illustrates a semiconductor device according to an embodiment of the present invention.

FIG. 22 illustrates an example in which a liquid crystal display module is formed as a semiconductor device by using a TFT substrate 2600 formed using the TFT described in Embodiment 1 or Embodiment 2.

FIG. 22 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

Through the above process, a liquid crystal display panel having stable electric characteristics and high reliability as a semiconductor device can be manufactured.

Note that the structure described in this embodiment can be combined with any of the structures described in other embodiments as appropriate.

[Embodiment 6]

In this embodiment, an example of electronic paper will be described as a semiconductor device to which the thin film transistor described in Embodiment 1 or Embodiment 2 is applied.

Figure 23:
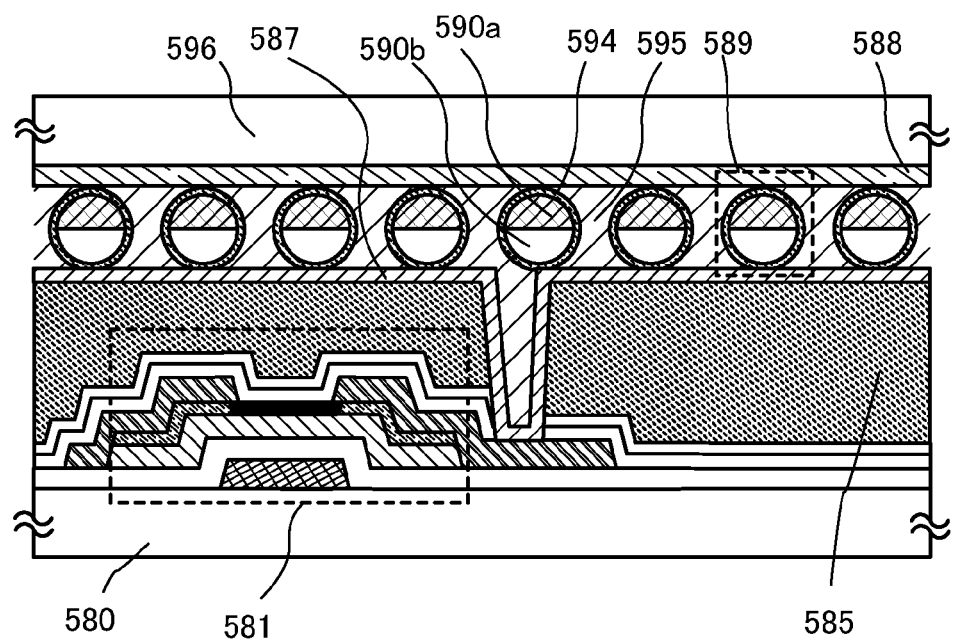
FIG. 23 illustrates a semiconductor device according to an embodiment of the present invention.

FIG. 23 illustrates active matrix electronic paper as an example of a semiconductor device. A thin film transistor 581 used for the semiconductor device can be manufactured by application of the thin film transistor described in Embodiment 1 or Embodiment 2.

The electronic paper in FIG. 23 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a thin film transistor with a bottom-gate structure, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (see FIG. 23). In Embodiment 8, the first electrode layer 587 corresponds to a pixel electrode, and the second electrode layer 588 corresponds to a common electrode. The second electrode layer 588 is electrically connected to a common potential line provided over the same substrate as the thin film transistor 581. A common connection portion described in Embodiment 2 is used, whereby the second electrode layer 588 provided on a substrate 596 and the common potential line can be electrically connected to each other through the conductive particles arranged between a pair of substrates.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

In this way, an electrophoretic display element utilizes a so-called dielectrophoretic effect by which a substance having a high dielectric constant moves to a high-electric field region. An electrophoretic display device using an electrophoretic display element does not need to use a polarizer, which is required in a liquid crystal display device, and both the thickness and weight of the electrophoretic display device can be decreased compared with those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained with the thin film transistor described in any one of Embodiments 1 to 3 can be used.

Note that the microparticles may be formed using a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through this process, electronic paper having stable electric characteristics and high reliability as a semiconductor device can be manufactured.

Note that the structure described in this embodiment can be combined with any of the structures described in other embodiments as appropriate.

[Embodiment 7]

In this embodiment, an example of a light-emitting display device will be described as the semiconductor device to which the thin film transistor described in any of Embodiments 1 to 3 is applied. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 24:
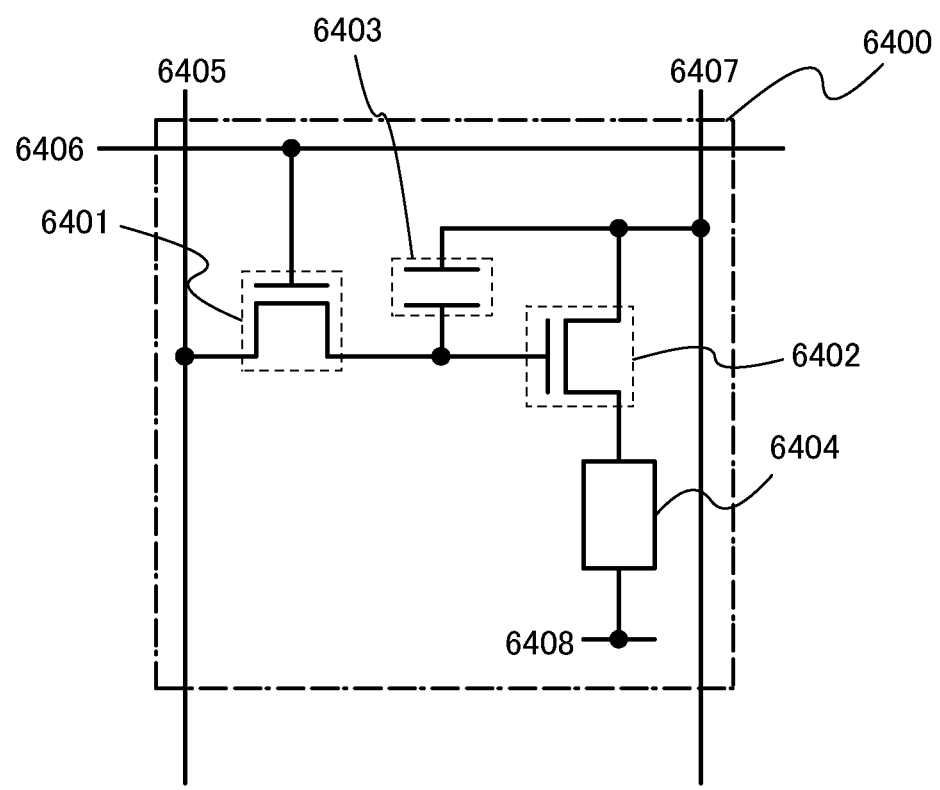
FIG. 24 illustrates a pixel equivalent circuit of a semiconductor device according to an embodiment of the present invention.

FIG. 24 illustrates an example of a pixel structure to which digital time grayscale driving can be applied, as an example of a semiconductor device to which one embodiment of the present invention is applied.

A structure and operation of a pixel to which digital time grayscale driving can be applied are described. Here, an example is described in which one pixel includes two n-channel transistors each of which is described in Embodiment 1 or Embodiment 2 and each of which includes the oxide semiconductor layer typified by an In—Ga—Zn—O-based non-single-crystal film in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the connection portion may be used as a common connection portion.

The second electrode (common electrode 6408) of the light-emitting element 6404 is set to a low power supply potential. Note that the low power supply potential is a potential satisfying the low power supply potential <a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line +Vth of the driver transistor 6402) is applied to the signal line 6405.

In the case of performing analog grayscale driving instead of digital time grayscale driving, the same pixel structure as in FIG. 24 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the present invention is not limited to the pixel structure shown in FIG. 24. For example, a switch, a resistor, a capacitor, a transistor, a logic circuit, or the like may be added to the pixel shown in FIG. 24.

Next, a structure of a light emitting element will be described with reference to FIGS. 25A to 25C. Here, a cross-sectional structure of a pixel will be described by taking an n-channel driving TFT as an example. Driving TFTs 7001, 7011, and 7021 used for the semiconductor devices illustrated in FIGS. 25A to 25C can be manufactured similarly to the thin film transistors described in Embodiment 1 or Embodiment 2 and are thin film transistors having stable electric characteristics and high reliability, in which an oxide semiconductor layer typified by an In—Ga—Zn—O-based non-single-crystal film is used.

In order to extract light emitted from the light-emitting element, at least one of an anode and a cathode is required to transmit light. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light emitting element having a top emission structure is described with reference to FIG. 25A.

Figure 25A:
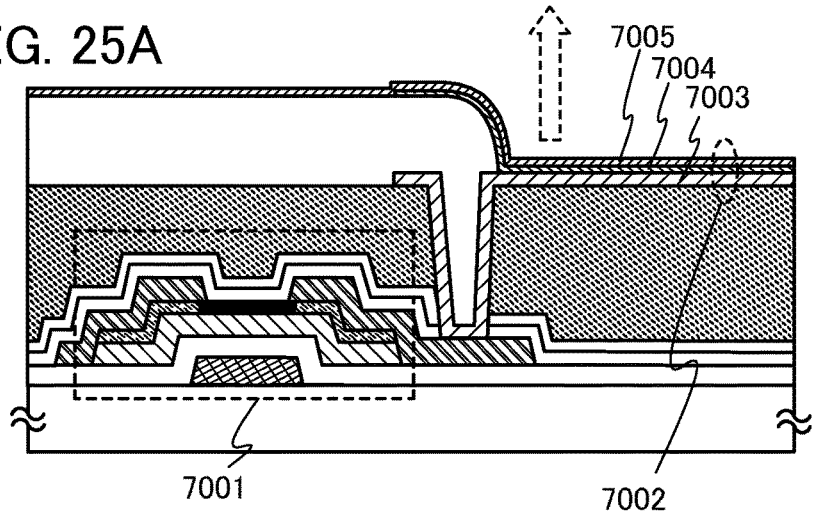
FIGS. 25A to 25C illustrate a semiconductor device according to an embodiment of the present invention.

FIG. 25A is a cross-sectional view of a pixel in the case where the TFT 7001 serving as a driver TFT is an n-channel TFT and light generated in a light-emitting element 7002 is emitted to pass through an anode 7005. In FIG. 25A, a cathode 7003 of the light-emitting element 7002 and the TFT 7001, which is the driving TFT, are electrically connected to each other, and a light-emitting layer 7004 and the anode 7005 are sequentially stacked over the cathode 7003. The cathode 7003 can be formed using a variety of conductive materials as long as they have a low work function and reflect light. For example, Ca, Al, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of a pixel shown in FIG. 25A, light which is emitted from the light emitting element 7002 is emitted to the anode 7005 side as indicated by an arrow.

Next, a light emitting element having a bottom emission structure is described with reference to FIG. 25B. FIG. 21B is a cross-sectional view of a pixel in the case where the driving TFT 7011 is of an n-type and light is emitted from a light-emitting element 7012 to a cathode 7013 side. In FIG. 25B, the cathode 7013 of the light-emitting element 7012 is formed over a light-transmitting conductive film 7017 which is electrically connected to the driver TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. The cathode 7013 can be formed using any of a variety of conductive materials as long as it has a low work function similarly to FIG. 25A. The cathode 7013 is formed to have a thickness that can transmit light (preferably, approximately 5 nm to 30 nm). For example, an aluminum film with a thickness of 20 nm can be used as the cathode 7013. Then, the light emitting layer 7014 may be formed using either a single layer or a stacked layer of a plurality of layers similarly to FIG. 25A. Although the anode 7015 is not required to be transmit light, a light-transmitting conductive material can be used to form the anode 7015 similarly to FIG. 25A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of a pixel shown in FIG. 25B, light which is emitted from the light emitting element 7012 is emitted to the cathode 7013 side as indicated by an arrow.

Figure 25B:
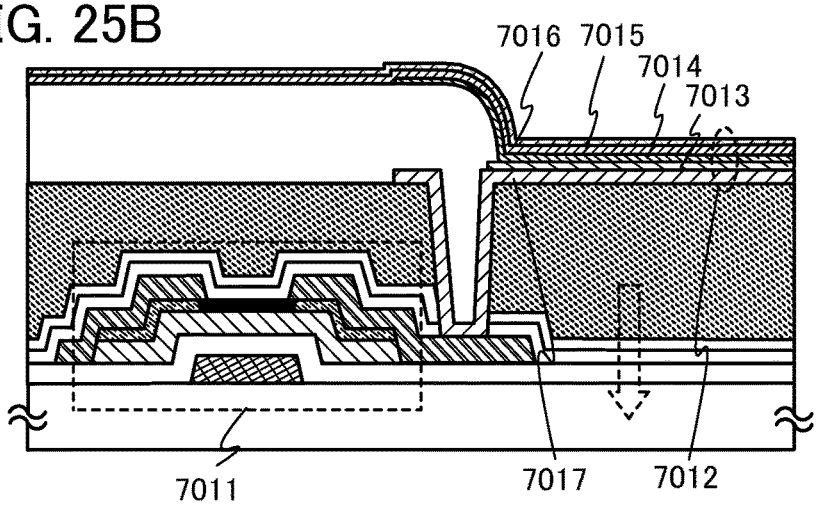
Figure 25C:
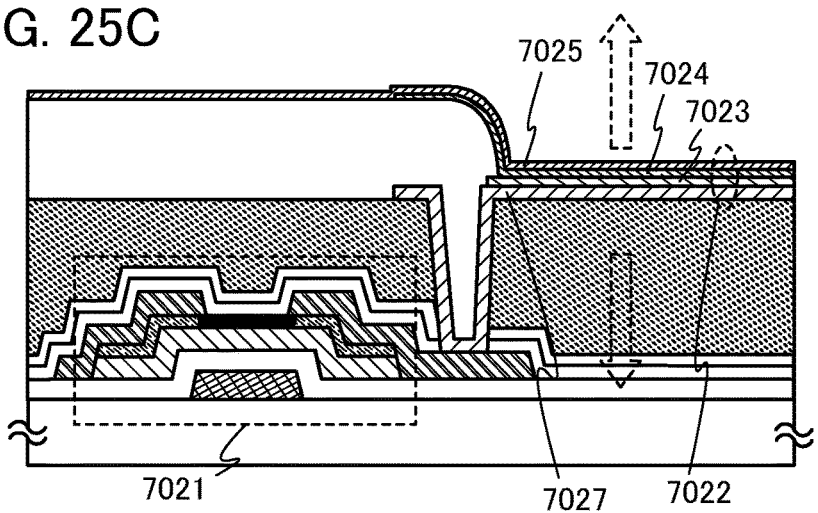

Description is made on a light emitting element having the dual emission structure with reference to FIG. 25C. In FIG. 25C, a cathode 7023 of a light-emitting element 7022 is formed over a light-transmitting conductive film 7027 which is electrically connected to a driver TFT 7021, and a light-emitting layer 7024 and an anode 7025 are stacked in this order over the cathode 7023. The cathode 7023 can be formed using any of a variety of conductive materials as long as it has a low work function similarly to FIG. 25A. The cathode 7023 is formed to have a thickness that can transmit light. For example, a film of Al having a thickness of 20 nm can be used as the cathode 7023. Then, the light emitting layer 7024 may be formed using either a single layer or a stacked layer of a plurality of layers similarly to FIG. 25A. A light-transmitting conductive material can be used to form the anode 7025 as in the case of FIG. 25A.

The light-emitting element 7022 corresponds to a region where the cathode 7023, the light-emitting layer 7024, and the anode 7025 overlap with one another. In the case of the pixel shown in FIG. 25C, light which is emitted from the light emitting element 7022 is emitted to both the anode 7025 side and the cathode 7023 side as indicated by arrows.

Note that, although the organic EL elements are described here as the light-emitting elements, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

The semiconductor device described in this embodiment is not limited to the structures illustrated in FIGS. 25A to 25C, and can be modified in various ways based on the spirit of techniques according to the present invention.

Next, the appearance and cross section of a light-emitting display panel (also referred to as a light-emitting panel) which corresponds to one embodiment of the semiconductor device to which the thin film transistor described in any of Embodiments 1 to 3 is applied is described with reference to FIGS. 26A and 26B. FIG. 26A is a plan view of a panel in which a thin film transistor and a light-emitting element formed over a first substrate are sealed between the first substrate and a second substrate with a sealant, and FIG. 26B is a cross-sectional view taken along H-I of FIG. 26A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal-line driver circuits 4503a and 4503b, and the scan-line driver circuits 4504a and 4504b provided over the first substrate 4501 each include a plurality of thin film transistors, and a thin film transistor 4510 included in the pixel portion 4502 and a thin film transistor 4509 included in the signal-line driver circuit 4503a are illustrated as an example in FIG. 26B.

As the thin film transistors 4509 and 4510, thin film transistors having stable electric characteristics and high reliability, which are described in any of Embodiments 1 to 3 and include the oxide semiconductor layer typified by an In—Ga—Zn—O-based non-single-crystal film, can be used. In Embodiment 9, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, the electroluminescent layer 4512, and the second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

As the second substrate 4506 located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. In addition, only the signal-line driver circuit or only part thereof, or only the scan-line driver circuit or only part thereof may be separately formed and mounted. This embodiment is not limited to the structure illustrated in FIGS. 26A and 26B.

Through this process, a light-emitting display device (display panel) having stable electric characteristics and high reliability as a semiconductor device can be manufactured.

Note that the structure described in this embodiment can be combined with any of the structures described in other embodiments as appropriate.

[Embodiment 8]

A semiconductor device to which the thin film transistor described in any of Embodiments 1 to 3 is applied can be applied as electronic paper. Electronic paper can be used for electronic appliances of a variety of fields as long as they can display data. For example, electronic paper can be applied to an e-book reader (electronic book), a poster, an advertisement in a vehicle such as a train, or displays of various cards such as a credit card. Examples of such electronic devices are illustrated in FIGS. 27A and 27B and FIG. 28.

Figure 27A:
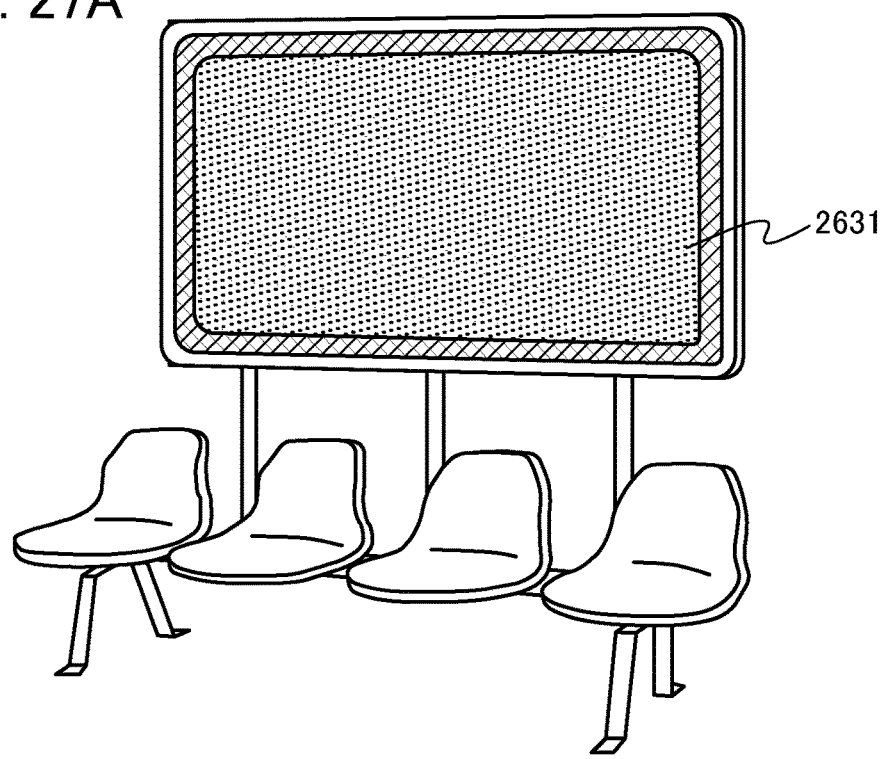
FIGS. 27A and 27B each illustrate an example of applications of electronic paper.

FIG. 27A illustrates a poster 2631 formed using electronic paper. In the case where an advertising medium is printed paper, the advertisement is replaced by hands; however, by using the electronic paper, the advertising display can be changed in a short time. Furthermore, stable images can be obtained without display defects. Note that the poster may have a configuration capable of wirelessly transmitting and receiving data.

Figure 27B:
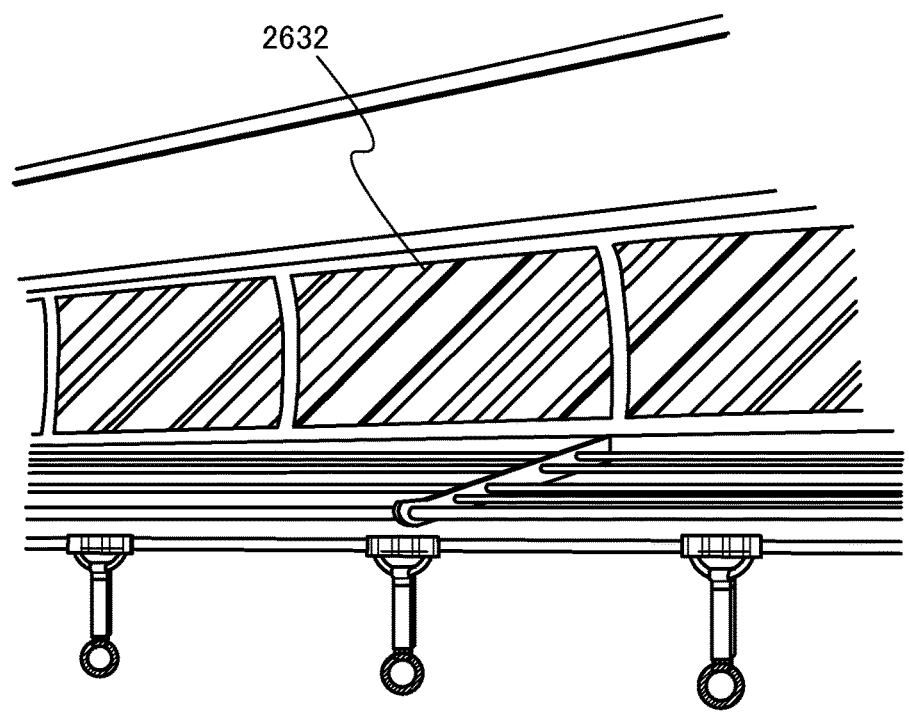

FIG. 27B illustrates an advertisement 2632 in a vehicle such as a train. In a case where an advertising medium is paper, a man replaces advertising, but in a case where it is electronic paper, much manpower is not needed and replacement of advertising can be conducted in short time. Furthermore, stable images can be obtained without display defects. Note that the advertisement in a vehicle may have a configuration capable of wirelessly transmitting and receiving data.

Figure 28:
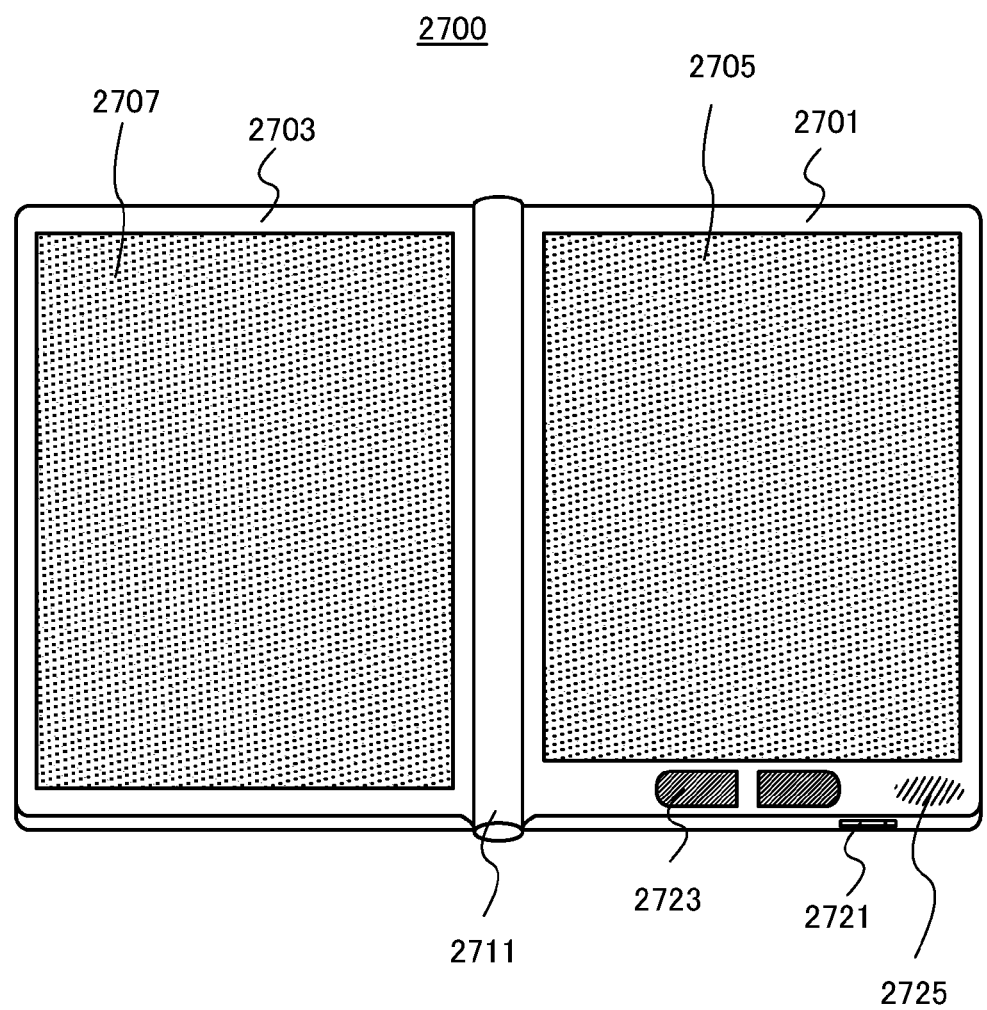
FIG. 28 illustrates an external view of an example of an electronic book device.

FIG. 28 illustrates an example of an electronic book 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. When the display portions display different images, text can be displayed on the right display portion (the display portion 2705 in FIG. 28) and an image can be displayed on the left display portion (the display portion 2707 in FIG. 28), for example.

Further, FIG. 28 illustrates an example where the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Note that the structure described in this embodiment can be combined with any of the structures described in other embodiments as appropriate.

[Embodiment 9]

The semiconductor device including the thin film transistor described in any of Embodiments 1 to 3 can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 29A:
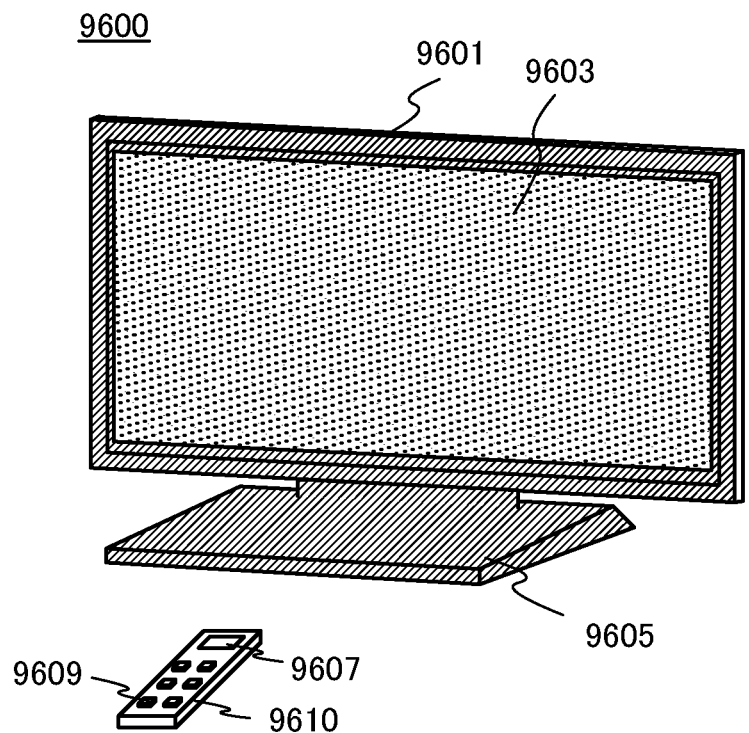
FIG. 29A illustrates an external view of an example of a television device and FIG. 29B illustrates an external view of an example of a digital photo frame.

FIG. 29A illustrates an example of a television device 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 29B:
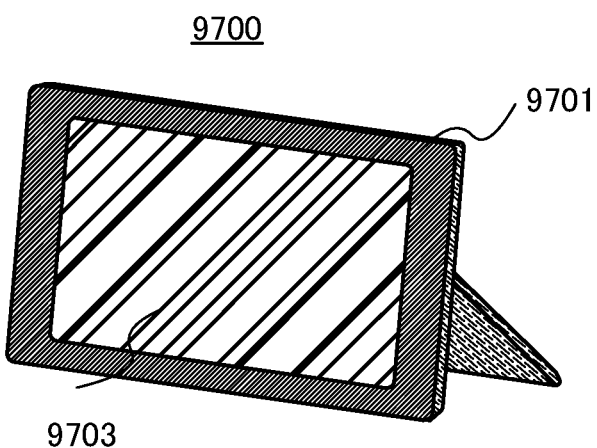

FIG. 29B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 30A:
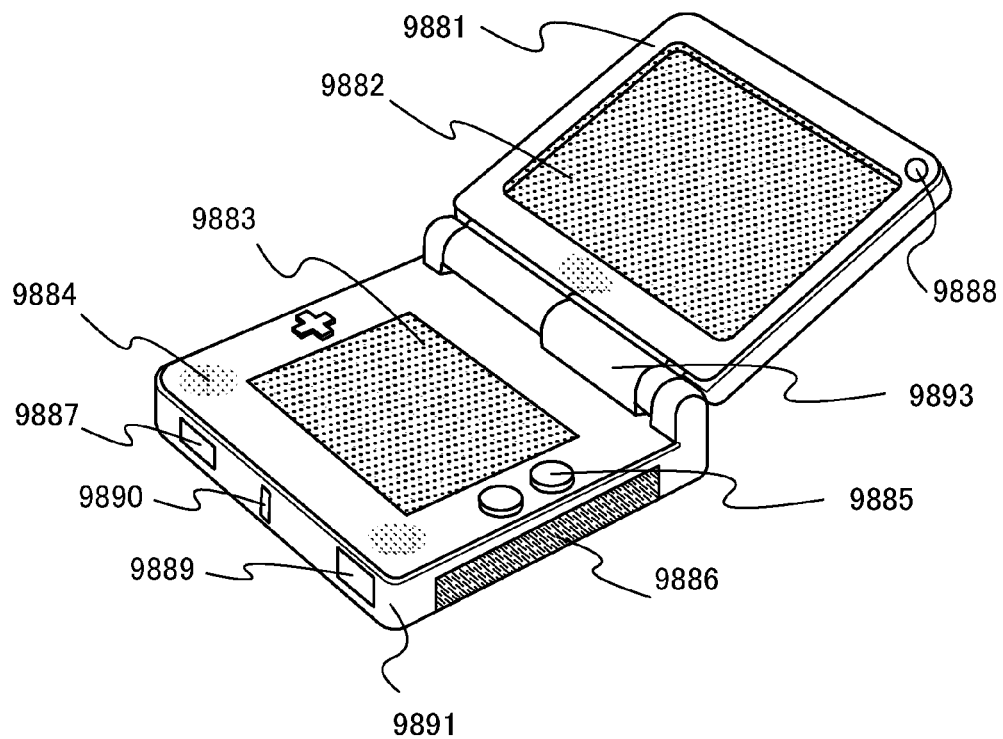
FIGS. 30A and 30B are external views of examples of amusement machines.

FIG. 30A illustrates a portable game machine including a housing 9881 and a chassis 9891 which are jointed with a connector 9893 so as to be able to open and close. A display portion 9882 and a display portion 9883 are incorporated in the housing 9881 and the housing 9891, respectively. The portable game machine illustrated in FIG. 30A additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), and a microphone 9889), and the like. Needless to say, the structure of the portable game machine is not limited to the above, and may be any structure as long as a semiconductor device according to one embodiment of the present invention is provided. Moreover, another accessory may be provided as appropriate. The portable game machine illustrated in FIG. 30A has a function of reading out a program or data stored in a storage medium to display it on the display portion and a function of sharing information with another portable game machine by wireless communication. The functions of the portable game machine illustrated in FIG.

30A are not limited to these, and the portable game machine can have a variety of functions.

Figure 30B:
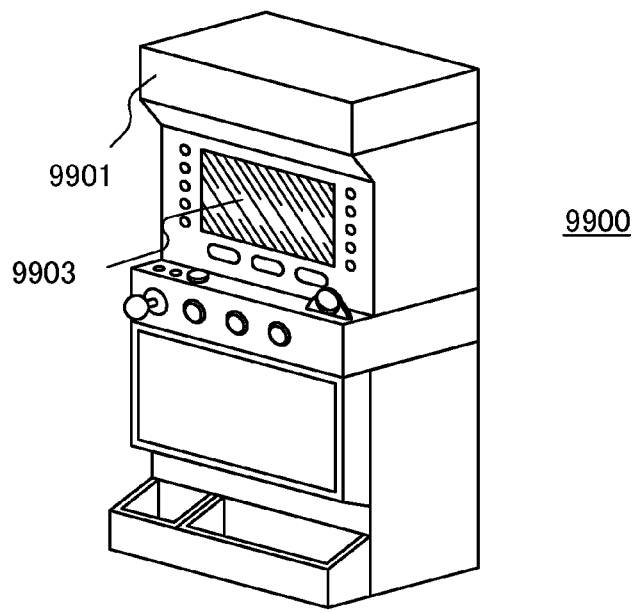

FIG. 30B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 31A:
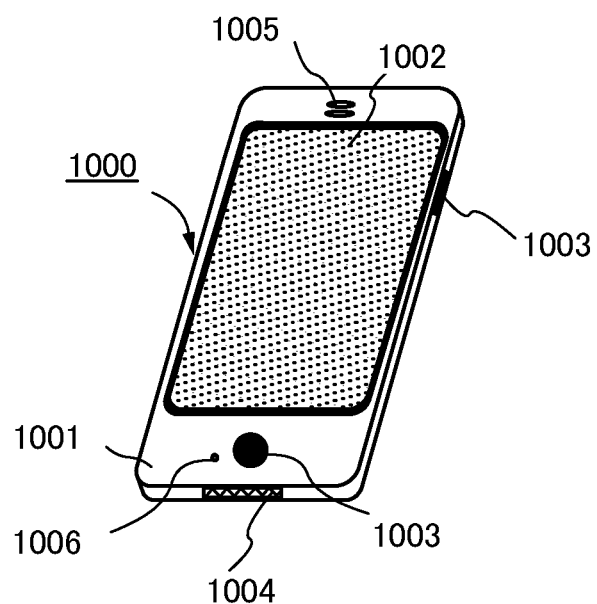
FIGS. 31A and 31B illustrate external views of examples of mobile phones.

FIG. 31A illustrates an example of a mobile phone 1000. The mobile phone 1000 includes a display portion 1002 incorporated in a housing 1001, an operation button 1003, an external connection port 1004, a speaker 1005, a microphone 1006 and the like.

When the display portion 1002 of the mobile phone 1000 illustrated in FIG. 31A is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 31B:
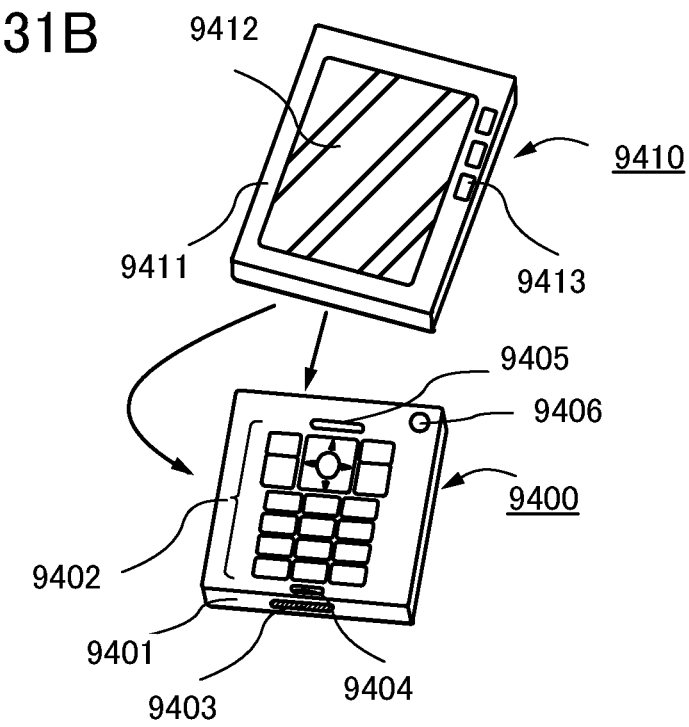

FIG. 31B illustrates another example of a mobile phone. The mobile phone in FIG. 31B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function by moving in two directions represented by arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Note that the structure described in this embodiment can be combined with any of the structures described in other embodiments as appropriate.

EXAMPLE 1

In this example, evaluation results of the conductivity of an oxide semiconductor which is used for the oxide semiconductor layer and the buffer layer in any of the above embodiments will be shown.

In this example, an In—Ga—Zn—O-based non-single-crystal film (hereinafter referred to as an IGZO film) formed by a sputtering method in an atmosphere of an argon gas and an oxygen gas and an In—Ga—Zn—O—N-based non-single-crystal film (hereinafter referred to as an IGZON film) formed by a sputtering method in an atmosphere of an argon gas and a nitrogen gas were each formed over a glass substrate. The IGZO film and the IGZON film, which had been formed, were subjected to heat treatment in an atmospheric atmosphere and heat treatment in a nitrogen atmosphere a plurality of times. After each heat treatment, the sheet resistance values of the IGZO film and the IGZON film were measured and the conductivity thereof was calculated. Each step of this example is described in detail below.

First, the glass substrates were cleaned with pure water. Note that product name EAGLE 2000 (manufactured by Corning Inc., alkali-free glass) was used for the glass substrate. Next, the IGZO film and the IGZON film were each formed over the glass substrate. The IGZO film was formed using a target of an oxide semiconductor of $In_2O_3$:$Ga_2O_3$:$ZnO$=1:1:1 under conditions where the distance between the substrate and the target was 60 mm, the pressure was 0.4 Pa, direct current (DC) power was 0.5 kW, the film thickness was 50 nm, the flow rate ratio of film formation gasses of Ar:$O_2$ was 30:15 (sccm), and the film formation temperature was room temperature. The IGZON film was formed under conditions similar to those of the IGZO film except that the flow rate ratio of film formation gasses of Ar to $N_2$ was 35:5 (sccm). Note that the IGZO film and the IGZON film were formed so that the thicknesses thereof were about 50 nm, and the actual thicknesses were measured by an ellipsometer after the formation. Then, the sheet resistance values of the IGZO film and the IGZON film were measured by a sheet resistance measuring apparatus. Note that conductivity can be obtained by a sheet resistance value and a film thickness.

Next, reverse sputtering treatment was performed on the IGZO film and the IGZON film under conditions where an Ar gas flow rate was 50 sccm, the pressure was 0.6 Pa, direct current (DC) power was 0.2 kW, and treatment time was 3 minutes. After the reverse sputtering, the sheet resistance values of the IGZO film and the IGZON film were measured and the conductivity thereof was calculated.

Next, the IGZO film and the IGZON film were repeatedly subjected to heat treatment in an atmospheric atmosphere (hereinafter referred to as air baking) under conditions of a treatment temperature of 350° C. and treatment time of 1 hour, and heat treatment in a nitrogen atmosphere (hereinafter referred to as nitrogen baking) under similar conditions in a treatment temperature and treatment time. The heat treatments were performed in two ways, a process A and a process B. In the process A, air baking, nitrogen baking, air baking, and nitrogen baking were performed in this order as the heat treatment after the reverse sputtering treatment. In the process B, nitrogen baking, air baking, and nitrogen baking were performed in this order as the heat treatment after the reverse sputtering treatment. In other words, the process B is a process in which the first air baking was omitted in the process A.

TABLE 1

| Process A | Conductivity of IGZO film (S/cm) | Conductivity of IGZON film (S/cm) |
|---|---|---|
| Directly after film formation | <<0.01 | <<0.01 |
| After reverse sputtering | 1.72 | 3.49 |
| After air baking | <<0.01 | <<0.01 |
| After nitrogen baking | <<0.01 | 1.82 |
| After air baking | <<0.01 | <<0.01 |
| After nitrogen baking | <<0.01 | 1.65 |

TABLE 2

| Process B | Conductivity of IGZO film (S/cm) | Conductivity of IGZON film(S/cm) |
|---|---|---|
| Directly after film formation | <<0.01 | <<0.01 |
| After reverse sputtering | 1.72 | 3.49 |
| After nitrogen baking | 139 | 290 |
| After air baking | <<0.01 | <<0.01 |
| After nitrogen baking | 0.15 | 65.2 |

Table 1 shows the conductivity of the IGZO film and the IGZON film in the process A, and Table 2 shows the conductivity of the IGZO film and the IGZON film in the process B. The unit for the conductivity is S/cm both in Table 1 and in Table 2. Note that the conductivity of a film whose sheet resistance value was too high to be measured by the sheet resistance measuring apparatus is <<0.01 S/cm.

In each of Table 1 and Table 2, when the IGZO film and the IGZON film which were formed through the same process are compared to each other, the conductivity of the IGZON film is higher than that of the IGZO film. In addition, after the reverse sputtering treatment, the conductivity of the IGZO films and the IGZON films is increased. The conductivity of the IGZO films and the IGZON films is reduced after the air baking and increased after the nitrogen baking. In addition, when the air baking is performed on the IGZO films and the IGZON films, whose conductivity has been increased by the nitrogen baking, the conductivity of the IGZO films and the IGZON films is reduced to be less than the lower limit for measurement.

When the conductivity of the IGZO film and the IGZON film after the first nitrogen baking in the process A shown in Table 1 and that of the IGZO film and the IGZON film after the second nitrogen baking in the process B shown in Table 2 are compared to each other, the conductivity of both of the IGZO film and the IGZON film in the latter case is higher than that in the former case, even though the conductivity becomes 0.01 S/cm or less by the air baking in the process A and the process B. This shows that the conductivity of the IGZO film and the IGZON film is decreased when the atmosphere of the first heat treatment after the film formation is an atmospheric atmosphere, and increased when the atmosphere is a nitrogen atmosphere. Furthermore, the following is presumed: even when heat treatments in different atmospheres are performed a plurality of times after the film formation, effect of subsequent heat treatment in a different atmosphere is lowered depending on the atmosphere of the first heat treatment after the film formation.

Accordingly, an In—Ga—Zn—O-based non-single-crystal film which is formed in an atmosphere of an argon gas and an oxygen gas and then subjected to heat treatment in an atmospheric atmosphere is preferably used as the oxide semiconductor layer. With this film, the conductivity of the oxide semiconductor layer can be reduced and an off current can be reduced. As the buffer layer, an In—Ga—Zn—O—N-based non-single-crystal film which is formed in an atmosphere of an argon gas and a nitrogen gas and then subjected to heat treatment in a nitrogen atmosphere is preferably used. Thus, the conductivity of the low-resistance regions of the buffer layer is increased, and an ohmic contact between the oxide semiconductor layer and the source and drain electrode layers is formed, so that electric characteristics of a thin film transistor can be stabilized. In addition, it was shown that part of the buffer layer, whose conductivity had been increased by the heat treatment in a nitrogen atmosphere, was heated in an atmospheric atmosphere; thus, the conductivity of the part of the buffer layer was reduced, so that the high-resistance region is formed. Further, it was found that by heat treatment performed in an atmospheric atmosphere just after formation of the oxide semiconductor layer, increase in the conductivity of the oxide semiconductor layer was able to be suppressed even when heat treatment was performed in a nitrogen atmosphere in a later step. Furthermore, when the heat treatment is performed in an atmospheric atmosphere after formation of the oxide semiconductor layer and the heat treatment is performed in a nitrogen atmosphere after formation of the buffer layer, the conductivity of the oxide semiconductor layer, the low-resistance regions of the buffer layer, and the high-resistance region of the buffer layer can be kept appropriate.

This application is based on Japanese Patent Application serial no. 2009-090428 filed with Japan Patent Office on Apr. 2, 2009, the entire contents of which are hereby incorporated by reference.

What is claimed is:

1. A method for manufacturing a semiconductor device, comprising the steps of:
   forming a gate electrode layer over a substrate;
   forming a gate insulating layer over the gate electrode layer;
   forming a first oxide semiconductor film over the gate insulating layer by a sputtering method;
   performing heat treatment on the first oxide semiconductor film in an atmospheric atmosphere;
   forming a second oxide semiconductor film over the first oxide semiconductor film by a sputtering method;

performing heat treatment on the second oxide semiconductor film in a nitrogen atmosphere;
forming an oxide semiconductor layer and a buffer layer by etching the first oxide semiconductor film and the second oxide semiconductor film;
forming a conductive film over the oxide semiconductor layer and the buffer layer;
forming source and drain electrode layers by etching the conductive film; and
performing heat treatment on the buffer layer in an atmospheric atmosphere so as to form a first region and a second region in the buffer layer,
wherein the first region overlaps the source and drain electrode layers,
wherein the second region does not overlap the source and drain electrode layers,
wherein conductivity of the first region is higher than conductivity of the oxide semiconductor layer, and
wherein conductivity of the second region is lower than conductivity of the first region.

2. The method for manufacturing a semiconductor device, according to claim 1, wherein the second oxide semiconductor film is formed in an atmosphere of a rare gas and a nitrogen gas.

3. The method for manufacturing a semiconductor device, according to claim 1, further comprising the step of performing reverse sputtering treatment on the second oxide semiconductor film before performing heat treatment in the nitrogen atmosphere.

4. The method for manufacturing a semiconductor device, according to claim 1, wherein an edge portion of the first region is covered with the source or drain electrode layer.

5. The method for manufacturing a semiconductor device, according to claim 1, wherein the first oxide semiconductor layer comprises indium, gallium, and zinc.

6. The method for manufacturing a semiconductor device, according to claim 1, wherein the first oxide semiconductor layer comprises indium, tin, and zinc.

7. The method for manufacturing a semiconductor device, according to claim 1, wherein the first oxide semiconductor layer comprises gallium, tin, and zinc.

8. The method for manufacturing a semiconductor device, according to claim 1, wherein the first oxide semiconductor layer comprises a nanocrystal.

* * * * *